(12) United States Patent
Sugahara et al.

(10) Patent No.: US 9,842,992 B2
(45) Date of Patent: Dec. 12, 2017

(54) TRANSISTOR USING PIEZORESISTOR AS CHANNEL, AND ELECTRONIC CIRCUIT

(71) Applicant: JAPAN SCIENCE AND TECHNOLOGY AGENCY, Kawaguchi-shi, Saitama (JP)

(72) Inventors: Satoshi Sugahara, Yokohama (JP); Yusuke Shuto, Yokohama (JP); Minoru Kurosawa, Yokohama (JP); Hiroshi Funakubo, Yokohama (JP); Shuichiro Yamamoto, Yokohama (JP)

(73) Assignee: JAPAN SCIENCE AND TECHNOLOGY AGENCY, Kawaguchi-shi (JP)

( * ) Notice: Subject to any disclaimer, the term of this patent is extended or adjusted under 35 U.S.C. 154(b) by 0 days.

(21) Appl. No.: 15/125,840

(22) PCT Filed: Mar. 6, 2015

(86) PCT No.: PCT/JP2015/056694
§ 371 (c)(1),
(2) Date: Sep. 13, 2016

(87) PCT Pub. No.: WO2015/137256
PCT Pub. Date: Sep. 17, 2015

(65) Prior Publication Data
US 2017/0005265 A1 Jan. 5, 2017

(30) Foreign Application Priority Data

Mar. 14, 2014 (JP) .................. 2014-052529

(51) Int. Cl.
*H01L 49/00* (2006.01)
*H01L 27/24* (2006.01)
(Continued)

(52) U.S. Cl.
CPC ............ *H01L 49/00* (2013.01); *G11C 14/009* (2013.01); *G11C 14/0081* (2013.01);
(Continued)

(58) Field of Classification Search
CPC ......... H01L 27/22; H01L 27/24; H01L 49/00; H01L 27/226; H01L 27/2436;
(Continued)

(56) References Cited

U.S. PATENT DOCUMENTS 6,437,422 B1 8/2002 Solomon et al.
8,159,854 B2 4/2012 Elmegreen et al.
(Continued)

FOREIGN PATENT DOCUMENTS

JP 2004-527131 A 9/2004
JP 2007-317729 A 12/2007
JP 2014-518459 A 7/2016

OTHER PUBLICATIONS

Newns et al., "A low-voltage high-speed electronic switch based on piezoelectric transduction", Journal of Applied Physics, 111, 084509, p. 1, (2012).
(Continued)

*Primary Examiner* — Chuong A Luu
(74) *Attorney, Agent, or Firm* — Westerman, Hattori, Daniels & Adrian, LLP

(57) ABSTRACT

A transistor includes: a piezoresistor through which carriers conduct; a source that injects the carriers into the piezoresistor; a drain that receives the carriers from the piezoresistor; a piezoelectric material that is located so as to surround the piezoresistor and applies a pressure to the piezoresistor; and a gate that applies a voltage to the piezoelectric material so that the piezoelectric material applies a pressure to the piezoresistor.

20 Claims, 27 Drawing Sheets

(51) Int. Cl.
*H03K 3/356* (2006.01)
*G11C 14/00* (2006.01)
*H01L 27/22* (2006.01)
*G11C 11/16* (2006.01)

(52) U.S. Cl.
CPC ........ *H01L 27/226* (2013.01); *H01L 27/2436* (2013.01); *H03K 3/356* (2013.01); *G11C 11/16* (2013.01)

(58) Field of Classification Search
CPC ......... H01L 29/84; H01L 29/12; H01L 29/78; H01L 29/788; H01L 41/04; H01L 41/053
USPC ....................................................... 257/254
See application file for complete search history.

(56) References Cited

U.S. PATENT DOCUMENTS

2010/0328984 A1* 12/2010 Elmegreen ............ G11C 11/412
                                                                            365/72
2011/0133603 A1   6/2011 Elmegreen et al.
2013/0009668 A1   1/2013 Elmegreen et al.

OTHER PUBLICATIONS

International Search Report dated May 19, 2015, issued in counterpart International Application No. PCT/JP2015/056694 (2 pages).

\* cited by examiner

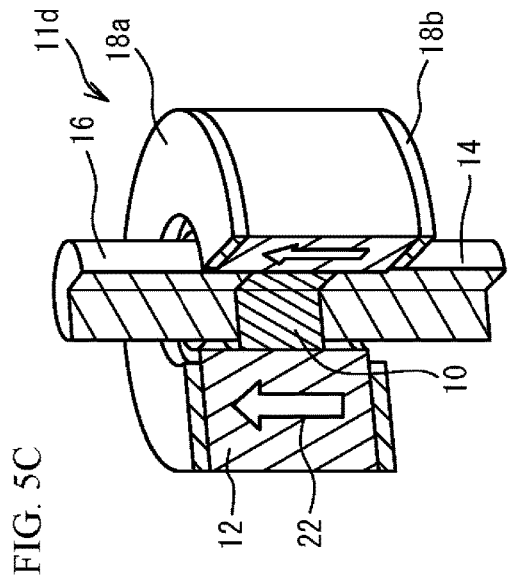
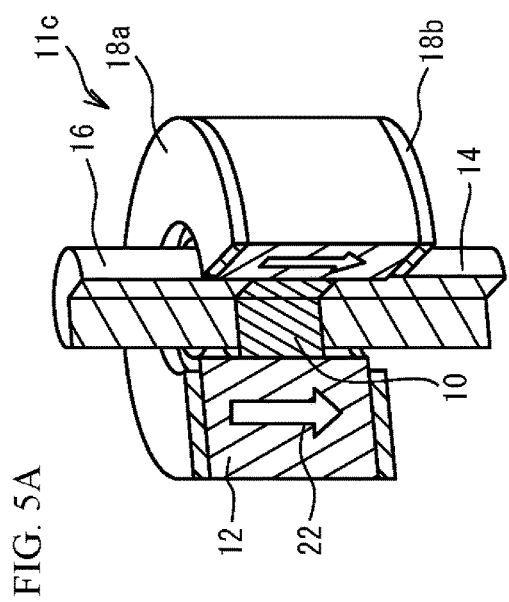
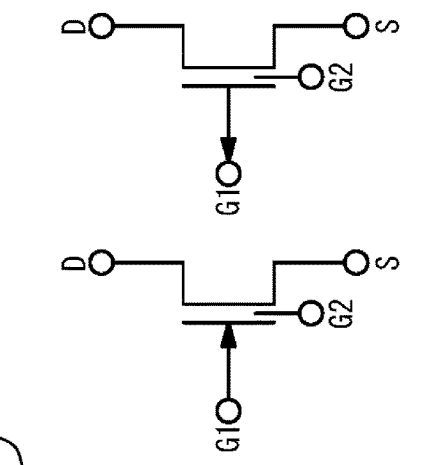
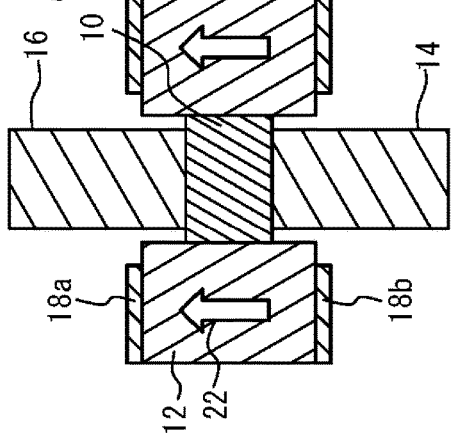
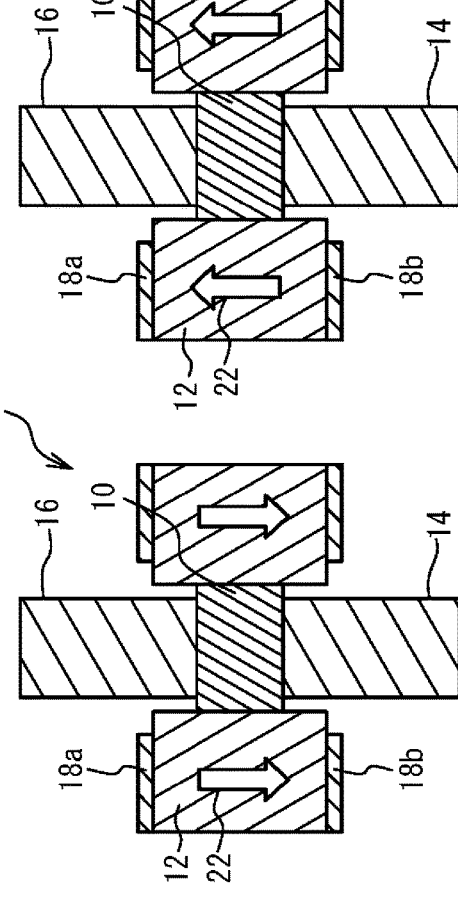

TRANSISTOR USING PIEZORESISTOR AS CHANNEL, AND ELECTRONIC CIRCUIT

TECHNICAL FIELD

The present invention relates to a transistor and an electronic circuit, and more particularly to, for example, a transistor using a piezoresistor as a channel and an electronic circuit.

BACKGROUND ART

Patent Document 1 discloses a transistor that uses a piezoresistor as a channel and provides a piezoelectric material applying a pressure to the piezoresistor in a gate.

PRIOR ART DOCUMENT

Patent Document

Patent Document 1: U.S. Pat. No. 8,159,854

SUMMARY OF THE INVENTION

Problem to be Solved by the Invention

However, the transistor of Patent Document 1 uses a support structure made of a material with high yield strength to apply a pressure to the piezoresistor channel from a piezoelectric gate (hereinafter, the piezoelectric material and the gate are collectively called a piezoelectric gate). Thus, the application efficiency of the pressure is insufficient, and interferes integration. Furthermore, when the source and the drain are switched, the characteristics change. Thus, the transistor of Patent Document 1 has difficulty in being used in a circuit that makes the source and the drain equivalent.

The present invention has been made in views of the above problems, and aims to provide a transistor and an electronic circuit in which a pressure can be effectively applied to a piezoresistor channel from a piezoelectric gate and a source and a drain can be switched without using a support structure made of a material with high yield strength to support a device (a transistor). Alternatively, the present invention aims to provide a transistor and an electronic circuit in which a source and a drain can be switched.

Means for Solving the Problem

The present invention is a transistor characterized by including: a piezoresistor through which carriers conduct; a source that injects the carriers into the piezoresistor; a drain that receives the carriers from the piezoresistor; a piezoelectric material that is located so as to surround the piezoresistor and applies a pressure to the piezoresistor; and a gate that applies a voltage to the piezoelectric material so that the piezoelectric material applies a pressure to the piezoresistor.

In the above configuration, the gate may be located so as to surround the piezoelectric material, and the piezoelectric material may be dielectrically polarized in a direction from the piezoresistor to the gate or in a direction from the gate to the piezoresistor.

In the above configuration, a plurality of the gates may be located in a direction parallel to a conduction direction of the carriers conducting through a channel in the piezoresistor, and the piezoelectric material may be dielectrically polarized in the direction parallel to the conduction direction.

In the above configuration, the piezoelectric material may be located so as to surround the piezoresistor in all directions perpendicular to a conduction direction of the carriers.

In the above configuration, the piezoelectric material may be located so as to partially surround the piezoresistor in directions perpendicular to a conduction direction of the carriers.

In the above configuration, a support that is formed on a substrate and supports the piezoresistor may be provided, an upper surface of the piezoresistor may be curved, and the piezoelectric material may surround the upper surface of the piezoresistor and a side surface of the support.

In the above configuration, a height of the support may be greater than a width of the piezoresistor.

In the above configuration, a material of the support may be identical to a material of the piezoresistor.

In the above configuration, a material of the support may differ from a material of the piezoresistor.

In the above configuration, the source and the drain may be symmetrical to each other across an intermediate plane between the source and the drain in the piezoresistor, and each of the piezoresistor, the piezoelectric material, and the gate may be symmetric with respect to the intermediate plane.

The present invention is an electronic circuit characterized by including: a circuit that is connected between a first power source and a second power source; and the above transistor in which one of the source and the drain is coupled to the first power source, another of the source and the drain is coupled to a supply terminal of the circuit, and a signal that cuts electric power supplied to the circuit is input to the gate.

In the above configuration, a bistable circuit that stores data, and a non-volatile element that stores, in a non-volatile manner, data stored in the bistable circuit, and restores the data stored in a non-volatile manner to the bistable circuit may be provided, and the circuit may be the bistable circuit.

In the above configuration, the non-volatile element may be connected between a node in the bistable circuit and a control line.

The present invention is an electronic circuit characterized by including: a non-volatile memory cell including: a non-volatile element; and the above transistor in which the source or the drain is connected in series to the non-volatile element.

The present invention is an electronic circuit characterized by including: first and second transistors that are the above transistor and complement each other, wherein dielectric polarization directions of the piezoelectric materials of the first and second transistors are opposite to each other, and are directions that allow the piezoelectric material to apply a pressure to the piezoresistor when a positive voltage or a negative voltage with respect to the source is applied to the gate.

The present invention is a transistor characterized by including: a piezoresistor through which carriers conduct in a first direction; a source that injects the carriers into the piezoresistor; a drain that receives the carriers from the piezoresistor; a piezoelectric material that applies a pressure to the piezoresistor in a second direction intersecting with the first direction; and a gate that applies a voltage to the piezoelectric material so that the piezoelectric material applies a pressure to the piezoresistor.

Effects of the Invention

The present invention can provide a transistor and an electronic circuit in which a pressure can be effectively applied to a piezoresistor channel from a piezoelectric gate and a source and a drain can be switched without using a support structure made of a material with high yield strength to support a device (a transistor). Alternatively, the present invention can provide a transistor and an electronic circuit in which a source and a drain can be switched.

BRIEF DESCRIPTION OF THE DRAWINGS

FIG. 5A through FIG. 5F are schematic views of transistors in accordance with a variation of the first embodiment;

MODES FOR CARRYING OUT THE EMBODIMENTS

Figure 1:
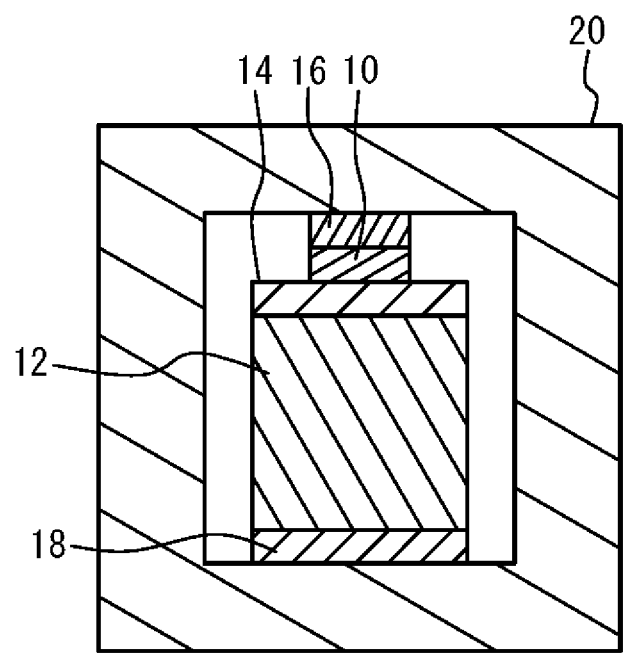
FIG. 1 is a cross-sectional view of a transistor in accordance with a first comparative example.

Recent microprocessors and Complementary Metal Oxide Semiconductor (CMOS) logic systems such as a System on a Chip (SoC) have been developed by miniaturizing and sophisticating a transistor. The improvement in current-driving performance and high-density integration due to the miniaturization of the transistor mainly contribute to the achievement of both the miniaturization and the sophistication. However, as the transistor is miniaturized (as a technology node is updated), its power consumption increases. The increase in power consumption becomes a serious problem that limits the performance of the logic system and the integration density of the transistors. Furthermore, in mobile devices such as smartphones, which are one of the most important applications of recent CMOS logic systems, the power consumption of the logic system is one factor that determines the available time of a battery.

Decreasing the power-supply voltage in a CMOS logic system is one of highly effective ways for decreasing the power consumption of the CMOS logic system. However, the decrease in voltage tremendously degrades the operation frequency (speed) of the logic system. In addition, the decrease in voltage significantly deteriorates the resistance to variations in devices. The above described problems caused by decreasing the power-supply voltage are mainly due to the deterioration of the current-driving performance of the transistor. Thus, sensitive transistors capable of driving larger current with smaller input voltage have been actively developed. Furthermore, for the ratio of the dynamic power and the static power to the total power consumption in low-voltage operation, the static power increases as the driving voltage decreases. Thus, desired is a transistor having a sufficiently low leak (sub-threshold leak) even in the low-voltage operation. Several new devices have been studied and developed based on the above described aspects. However, many of them have a high current-driving performance but have a large leak, or have a small leak but have a low current-driving performance.

In the ultralow voltage region where the power-supply voltage is approximately 0.2 V, significant reduction in power consumption is expected. However, in the conventional CMOS technology, the circuit performance remarkably deteriorates with decrease in current-driving performance in ultralow voltage operation. Thus, the application is difficult. The deterioration of the circuit performance is fundamentally insoluble with any semiconductor materials as long as a semiconductor is used as a channel. A metal channel has a low resistance, and thus may have a possibility of achieving a high current-driving performance at a low voltage. However, the leak is not sufficiently reduced in principle when a metal channel is used. Therefore, a metal-insulator transition material capable of forming two states, which are a state where the resistance is metallically low and a state where the resistance is insulatively high, may be considered to be used as a channel of a transistor. Such a transistor is considered a device suitable for the drive at an ultralow voltage. Recently, suggested is a new transistor called a Piezoelectronic Transistor (PET) that uses a piezoelectric material having a large piezoelectric effect for a gate and uses a piezoresistor having a piezoresistive effect that causes metal-insulator transition by a pressure for a channel (Patent Document 1).

FIG. 1 is a cross-sectional view of a transistor (PET) in accordance with a first comparative example. The first comparative example is an exemplary application of the structure of Patent Document 1. As illustrated in FIG. 1, a piezoresistor 10 is located between a source 14 and a drain 16. The piezoelectric material 12 is located under the source 14 (at the opposite side of the source 14 from the piezoresistor 10). A gate 18 is located under the piezoelectric material 12. The multilayered body from the gate 18 to the drain 16 is supported by a support structure 20 made of a material with high yield strength. When a voltage is applied between the source 14 and the gate 18, the piezoelectric material 12 is displaced. Accordingly, a pressure is applied to the piezoresistor 10 from the piezoelectric material 12.

The PET uses the piezoresistor 10 that transitions between a metal and an insulator by pressure for a channel. The piezoresistor 10 has a significantly low resistance in a metallic phase when it is turned on, and is expected to exhibit a high current-driving performance. The rate of resistance change to the pressure of the piezoresistor is enormous, and thus the channel resistance when the piezoresistor is turned off can be made to be significantly high. Thus, a sufficient ON/OFF current ratio is expected. Furthermore, in the PET, when the dielectric polarization directions of the piezoelectric materials 12 are made to be opposite, the same operations as a p channel operation and an n channel operation in a MOSFET can be achieved. Therefore, a circuit using complementary transistors, such as a CMOS circuit, can be structured.

To achieve a high current-driving performance and a steep sub-threshold characteristic in the PET, the use of the piezoelectric material 12 having a large piezoelectric effect is required. In addition to the characteristics of the piezoelectric material 12, the device structure that can efficiently apply a pressure to the piezoresistor from the piezoelectric material 12 is crucially important. The PETs ever suggested use a structure for supporting a device, such as the support structure 20 made of a material with high yield strength, to apply a pressure to the piezoresistor. The above described support structure is not suitable for the high-density integration of an integrated circuit. Furthermore, various parasitic elements formed by the presence of the support structure 20 may deteriorate the performance. In addition, the above described support structure is not suitable for highly efficiently applying a pressure from the piezoelectric material 12 to the channel formed of a piezoresistor. Accordingly, in the PET, it is important to achieve the device structure that can efficiently apply a pressure to the channel without using the above described structure for supporting a device.

The following embodiments can provide a PET that does not use a structure for supporting a device and has a device structure suitable for an integrated circuit. Furthermore, the following embodiments can provide a PET that has a structure capable of highly efficiently applying a pressure to the piezoresistor channel from the piezoelectric gate. The PET with this device structure can achieve a high current-driving performance and a steep sub-threshold characteristic. Furthermore, provided are a power gating circuit using a low impedance property of the PET and a memory circuit and a logic circuit with low power consumption that use the high-speed operation capability of the PET under a low voltage.

First Embodiment

Figure 2:
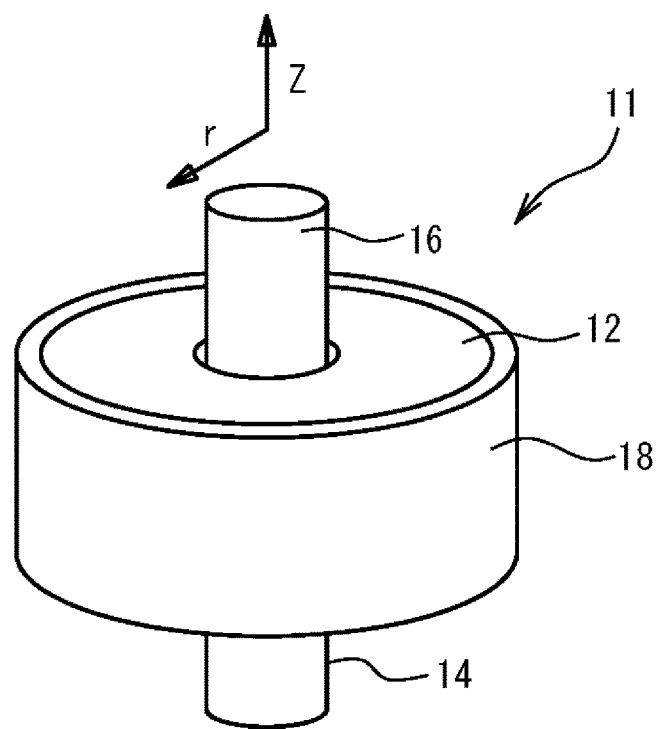
FIG. 2 is a perspective view of a transistor in accordance with a first embodiment.
Figure 3A:
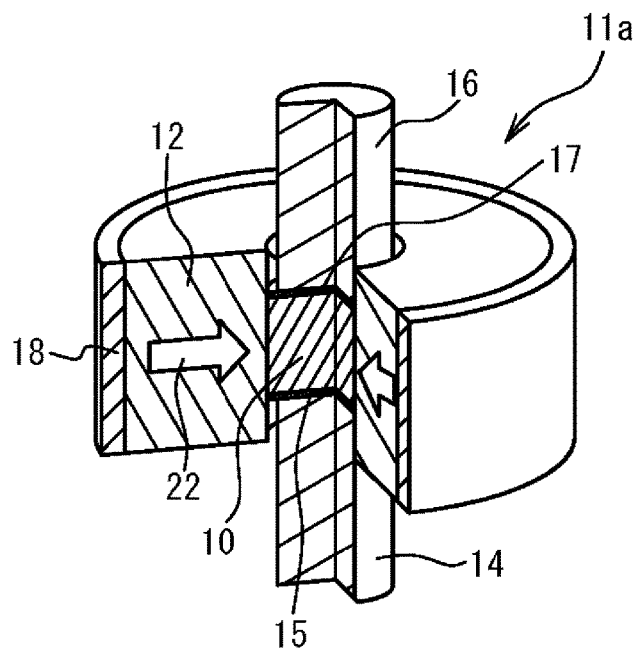
FIG. 3A is a perspective cross-sectional view of a first type transistor in accordance with the first embodiment.
Figure 3B:
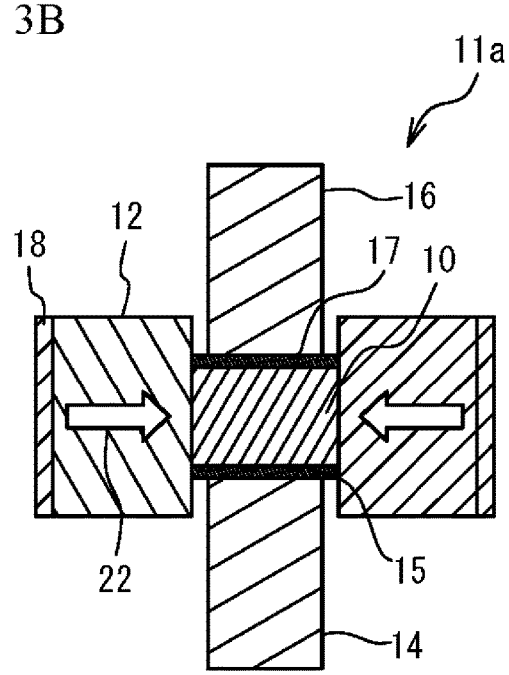
FIG. 3B is a cross-sectional view.
Figure 3C:
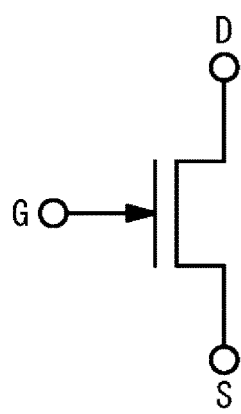
FIG. 3C illustrates a circuit symbol.
Figure 4A:
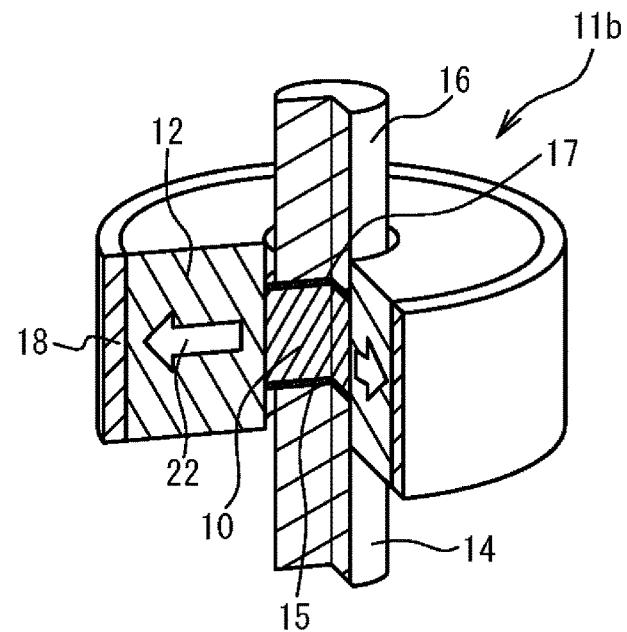
FIG. 4A is a perspective cross-sectional view of a second type transistor in accordance with the first embodiment.

A first embodiment is an exemplary PET. FIG. 2 is a perspective view of a transistor in accordance with the first embodiment. FIG. 3A is a perspective cross-sectional view of a first type transistor in accordance with the first embodiment, FIG. 3B is a cross-sectional view, and FIG. 3C illustrates a circuit symbol. FIG. 4A is a perspective cross-sectional view of a second type transistor in accordance with the first embodiment, FIG. 4B is a cross-sectional view, and FIG. 4C illustrates a circuit symbol.

As illustrated in FIG. 2 through FIG. 4C, the central axis in the piezoresistor 10 is defined as a z-axis, and the radial direction is defined as an r-direction. The piezoresistor 10 has a cylindrical shape. The source 14 and the drain 16 are located at both ends of the piezoresistor 10. The source 14 injects carriers (e.g., electrons) into the piezoresistor 10. The drain 16 receives the carriers from the piezoresistor 10. Carriers conduct through the piezoresistor 10 from the source 14 to the drain 16. Carriers conduct in the z-direction. A metal contact layer 15 is located between the source 14 and the piezoresistor 10, and a metal contact layer 17 is located between the drain 16 and the piezoresistor 10. The metal contact layers 15 and 17 make contact with the piezoelectric material 12, and are used to effectively apply a gate voltage to the piezoelectric material 12 when the piezoresistor 10 is in an insulator phase. The metal contact layers 15 and 17 preferably have small Young's modulus so that a pressure is effectively applied to the piezoresistor 10. The piezoelectric material 12 is located so as to surround the piezoresistor 10. The piezoelectric material 12 is doughnut-shaped. The gate 18 is located around the piezoelectric material 12.

As illustrated in FIG. 3A and FIG. 3B, in a first type transistor 11a, a dielectric polarization direction 22 of the piezoelectric material 12 is a minus r-direction. For example, when a positive voltage with respect to the source 14 is applied between the gate 18 and the source 14, the piezoelectric material 12 applies a pressure to the piezoresistor 10. This makes the piezoresistor 10 transition into a metallic phase. Thus, carriers conduct from the source 14 to the drain 16. When a voltage is not applied between the gate 18 and the source 14, a pressure is not applied to the piezoresistor 10, and the piezoresistor 10 is in an insulator phase. This blocks the conduction of carriers from the source 14 to the drain 16. As described above, in the first type transistor 11a, the piezoresistor 10 is turned on (transitions into a metallic phase) when a positive voltage with respect to the source 14 is applied to the gate 18. The above described behavior is considered equivalent to the behavior of an n channel FET in a MOSFET. Thus, hereinafter, the first type transistor 11a will be called an n channel for convenience sake, and represented by the circuit symbol illustrated in FIG. 3C. In FIG. 3C, a source S corresponds to the source 14, a drain D corresponds to the drain 16, and a gate G corresponds to the gate 18.

Figure 4B:
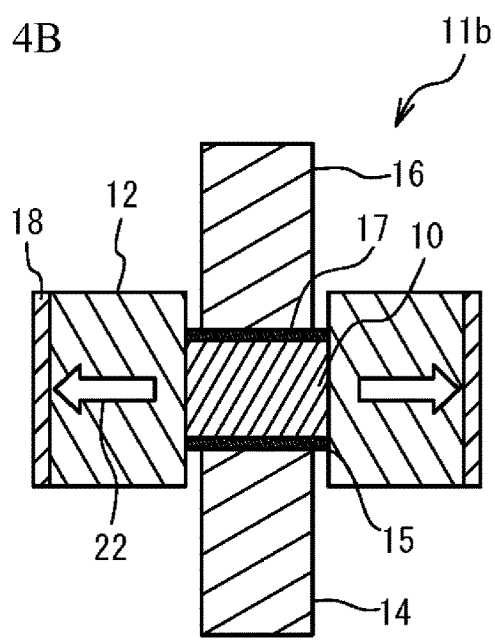
FIG. 4B is a cross-sectional view.
Figure 4C:
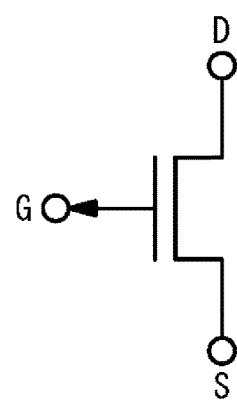
FIG. 4C illustrates a circuit symbol.

As illustrated in FIG. 4A and FIG. 4B, in a second type transistor 11b, the dielectric polarization direction 22 of the piezoelectric material 12 is a plus r-direction. For example, when a negative voltage with respect to the source 14 is applied between the gate 18 and the source 14, a pressure is applied to the piezoresistor 10. This makes the piezoresistor 10 transition into a metallic phase. When a voltage is not applied between the gate 18 and the source 14, a pressure is not applied to the piezoresistor 10, and the piezoresistor 10 is in an insulator phase. This blocks the conduction of carriers from the source 14 to the drain 16. As described above, in the second type transistor 11b, the piezoresistor 10 is turned on (transitions into a metallic phase) when a negative voltage with respect to the source 14 is applied to the gate 18. The above described behavior is considered equivalent to the behavior of a p channel FET in a MOSFET. Thus, hereinafter, the second type transistor 11b will be called a p channel for convenience sake, and represented by the circuit symbol illustrated in FIG. 4C.

As described above, the n channel and the p channel of a PET in the following description are determined not by whether carriers conducting through a channel made of the piezoresistor 10 are electrons or holes, but by whether their behavior is the same as the behavior of the n channel FET of a MOSFET or the behavior of the p channel FET.

FIG. 5A through FIG. 5F are schematic views of transistors in accordance with a variation of the first embodiment. FIG. 5A and FIG. 5C are perspective cross-sectional views, FIG. 5B and FIG. 5D are cross-sectional views, and FIG. 5E and FIG. 5F illustrate circuit symbols. As illustrated in FIG. 5A and FIG. 5B, in a transistor 11c, the dielectric polarization direction of the piezoelectric material 12 is a minus z-direction. Gates 18a and 18b are located on the piezoelectric material 12 so as to face each other in the z-direction. When a positive voltage with respect to the gate 18b is applied between the gates 18a and 18b, the piezoelectric material 12 can apply a pressure to the piezoresistor 10.

As illustrated in FIG. 5C and FIG. 5D, in a transistor 11d, the dielectric polarization direction of the piezoelectric material 12 is the z-direction. When a negative voltage with respect to the gate 18b is applied between the gates 18a and 18b, the piezoelectric material 12 can apply a pressure to the piezoresistor 10. Thus, the transistors 11c and 11d are transistors complementing each other.

In FIG. 5E and FIG. 5F, G1 corresponds to the gate 18a, and G2 corresponds to the gate 18b. For example, when G2 is connected to a reference voltage such as ground (or to a source), G2 may be omitted, and the circuit symbols illustrated in FIG. 3C and FIG. 4C can be used. Hereinafter, G2 is made to have an electric potential equal to that of the source, and the description thereof is omitted.

In the first embodiment, the gate 18 is located so as to surround the piezoelectric material 12. The piezoelectric material 12 dielectrically polarizes in the external or internal direction (for example, in a radial fashion with respect to the piezoresistor 10). In the variation of the first embodiment, a plurality of gates 18a and 18b are located on the surfaces, which face each other in the z-direction, of the piezoelectric material 12 (i.e., the surfaces perpendicular to the z-direction) in parallel to each other in the z-direction. The piezoelectric material 12 dielectrically polarizes in the z-direction. As described above, the dielectric polarization direction of the piezoelectric material 12 is configured as appropriate. Complementary transistors can be easily formed by making the dielectric polarization directions in the piezoelectric materials 12 opposite to each other.

In the first embodiment and the variation thereof, the piezoelectric material 12 surrounds the piezoresistor 10 and applies a pressure to the piezoresistor 10 from the circumference of the piezoresistor 10. Thus, there is no need to use the structure for supporting a device described in the first comparative example. An exemplary case where the piezoresistor 10 has a cylindrical shape and the piezoelectric material 12 has a doughnut shape has been described. However, the piezoresistor 10 and the piezoelectric material 12 may have other shapes. For example, the piezoresistor 10 may be a polygonal column such as a square pillar or the like. The corners of the polygonal column may be round-chamfered. In this case, in the first embodiment, the dielectric polarization direction in the piezoelectric material 12 is a direction from the piezoresistor 10 to the gate 18 or a direction from the gate 18 to the piezoresistor 10. In the variation of the first embodiment, the dielectric polarization direction is the z-direction. To apply a pressure to the piezoresistor 10 uniformly, the piezoresistor and the piezoelectric material 12 preferably have rotation symmetry around the z-axis.

In the first embodiment and the variation thereof (in the variation, when the metal contact layers 15 and 17 are formed), the metal contact layers 15 and 17 may be formed while making contact with the piezoelectric material 12, and may be used as the source 14 and the drain 16. In this case, the source 14 and the drain 16 may make contact with the piezoelectric material 12. As described above, when the source 14 and the drain 16 are made of a material with small Young's modulus (for example, a material with Young's modulus approximately equal to or less than that of the piezoresistor 10), the source 14 and the drain 16 may make contact with the piezoelectric material 12. When the source 14 and the drain 16 have large Young's modulus, air gaps are preferably formed between the source 14 and the piezoelectric material 12 and between the drain 16 and the piezoelectric material 12 as illustrated in FIG. 3A, FIG. 3B, FIG. 4A, FIG. 4B, and FIG. 5A through FIG. 5D. In FIG. 5A through FIG. 5D, air gaps are formed between the source 14 and the piezoelectric material 12 and between the drain 16 and the piezoelectric material 12. However, when the source 14 and the drain 16 has Young's modulus approximately equal to or less than that of the piezoresistor 10, the source 14 and the drain 16 may make contact with the piezoelectric material 12.

The piezoresistor 10 is made of a material that has a piezoresistive effect that changes an electric resistance depending on a mechanical pressure applied thereto. When a pressure is applied to the piezoresistor 10, the resistivity of the piezoresistor 10 preferably changes by at least double digits, more preferably at least quadruple digits, further preferably at least quintuple digits. For example, SmSe, TmSe, SmS, $Ca_2RuO_4$, $(Ca, Ba, SrRu)O_3$, $Ni(S_xSe_{1-x})_2C$, or $(V_{1-x}Cr_x)_2O_3$, which has the above described property, can be used for the piezoresistor 10.

The piezoelectric material 12 is made of a material that has an inverse piezoelectric effect, i.e., mechanically deforms the material by an applied voltage. The piezoelectric material 12 can be made of, for example, the following $ABC_3$ type perovskite structured material.

(Pb, M1)(Ti, M2)$O_3$,
(Bi, M1)(Zn, Ti, M2)$O_3$,
(Bi, M1)(Na, Ti, M2)$O_3$,
(K, M1)(Nb, M2)$O_3$, (Li, M1)(Nb, M2)O$_3$,
(Li, M1)(Ta, M2)O$_3$,
or
(Na, M1)(Nb, M2)O$_3$

Here, M1 is Li, Ca, Ba, Sr, Bi, Pb or lanthanoid of which the valence is one to three. M2 is Zr, Hf, Mg/Nb, Mg/Ta, or In/Sc of which the valence is two to six. The following material may be used as a material other than a perovskite structured material.
(Hf, M3)O$_2$ Here, M3 is Sr, Si, Ba, Ca, Mg, Zr, Ce, Ti, Ge, Sn, Nb, Ta, or lanthanoid. The piezoelectric material 12 can be made of, typically, lead zirconate titanate (PZT), strontium-added lead zirconate titanate (PSZT), magnesium niobate-lead titanate (PMT-PT), or zinc niobate-lead titanate (PZN-PT). The source 14, the drain 16, and the gate 18 are made of a conductive material such as metal.

The metal contact layers 15 and 17 preferably have small Young's modulus and a small resistivity. Al (68), Mg (65), Ag (76), Au (80), Pb (14), Ca (23), Sn (41), Bi (31), or In (10), which is a material having the above described properties, can be used. The number in parenthesis indicates Young's modulus (GPa). For example, the metal contact layers 15 and 17 preferably have Young's modulus approximately equal to or less than that of the piezoresistor 10.

The piezoresistor 10, the piezoelectric material 12, the metal contact layers 15 and 17, and the source 14, the drain 16, and the gate 18 can be formed by, for example, sputtering, or Chemical Vapor Deposition (CVD).

Transistor characteristics of the first embodiment and the first comparative example were simulated. The piezoresistor 10 was assumed to be made of SmSe, and the piezoelectric material 12 was assumed to be made of PMT-PT.

Figure 6A:
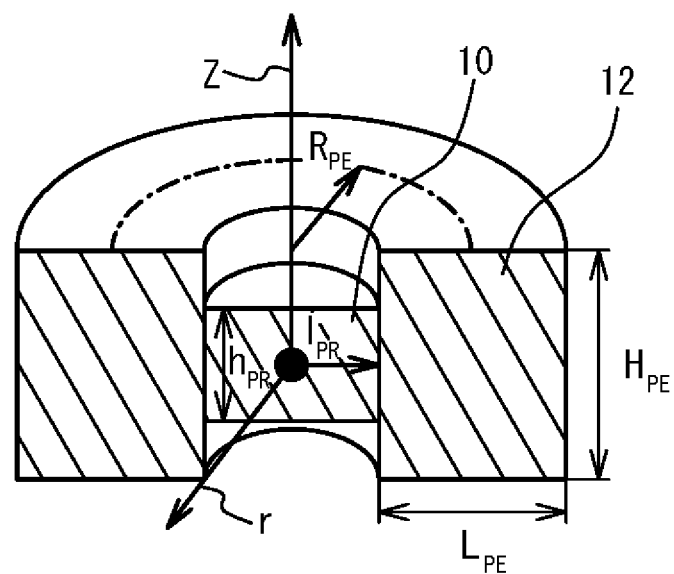
FIG. 6A and FIG. 6B illustrate dimensions of the first embodiment and the first comparative example used for simulations, respectively, where a source, a drain, a gate, and a metal contact are not illustrated for sake of simplicity.
Figure 6B:
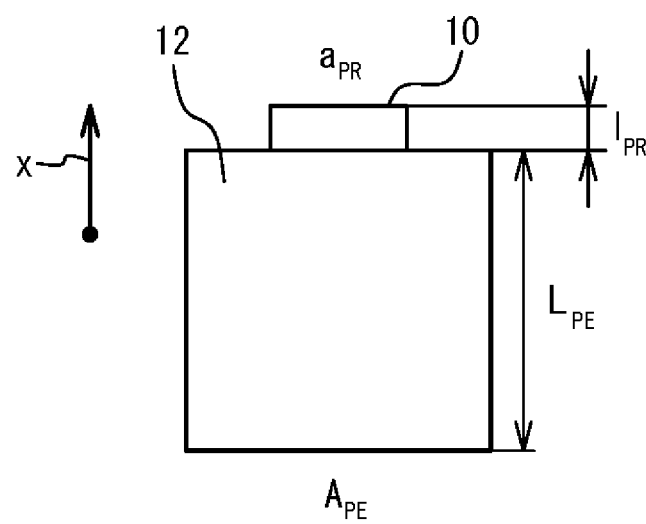

FIG. 6A and FIG. 6B illustrate dimensions of the first embodiment and the first comparative example used for the simulation, respectively. For sake of simplicity, the source, the drain, the gate, and the metal contact are not illustrated. As illustrated in FIG. 6A, in the first embodiment, the piezoelectric material 12 applies a pressure to the piezoresistor 10. The thickness of the piezoresistor 10 in the r-direction in which a pressure is applied is represented by $l_{PR}$ (corresponding to a radius), and the thickness of the piezoelectric material 12 in the r-direction is represented by $L_{PE}$. The thickness of the piezoresistor 10 in the z-direction is represented by $h_{PR}$, and the thickness of the piezoelectric material 12 in the z-direction is represented by $H_{PE}$. The distance from the z-axis to the middle of the piezoelectric material 12 in the r-direction is represented by $R_{PE}$. The area of the surface of the piezoresistor 10 through which a pressure is applied to the piezoresistor 10 from the piezoelectric material 12 (i.e., the surface of the piezoresistor 10 facing the piezoelectric material 12) is represented by $a_{PR}$, and the area of the surface of the piezoelectric material 12 through which the piezoelectric material 12 applies a pressure to the piezoresistor 10 is represented by $A_{PE}$. Here, $a_{PR}=2\pi l_{PR} h_{PR}$ and $A_{PE}=2\pi l_{PR} H_{PE}$. Thus, the area ratio $a_{PR}/A_{PE}=h_{PR}/H_{PE}$.

As illustrated in FIG. 6B, in the first comparative example, the direction in which the piezoelectric material 12 applies a pressure to the piezoresistor 10 is defined as an x-direction. The thickness of the piezoresistor 10 in the x-direction is represented by $l_{PR}$, and the thickness of the piezoelectric material 12 in the x-direction is represented by $L_{PE}$. The area of the surface of the piezoresistor 10 across which the piezoresistor faces the piezoelectric material 12 (the surface perpendicular to the x-direction) is represented by $a_{PR}$, and the area of the surface of the piezoelectric material 12 across which the piezoelectric material 12 faces the piezoresistor 10 is represented by $A_{PE}$.

Defining parameters of dimensions as described above allows for the comparison between the first embodiment and the first comparative example.

First, calculated was a coefficient α that indicates a ratio of a pressure P applied to the piezoresistor 10 to a gate voltage $V_G$ applied to the gate 18 in the first embodiment and the first comparative example where $P=\alpha V_G$. Larger coefficient α represents more efficient application of a pressure to the piezoresistor 10.

Figure 7A:
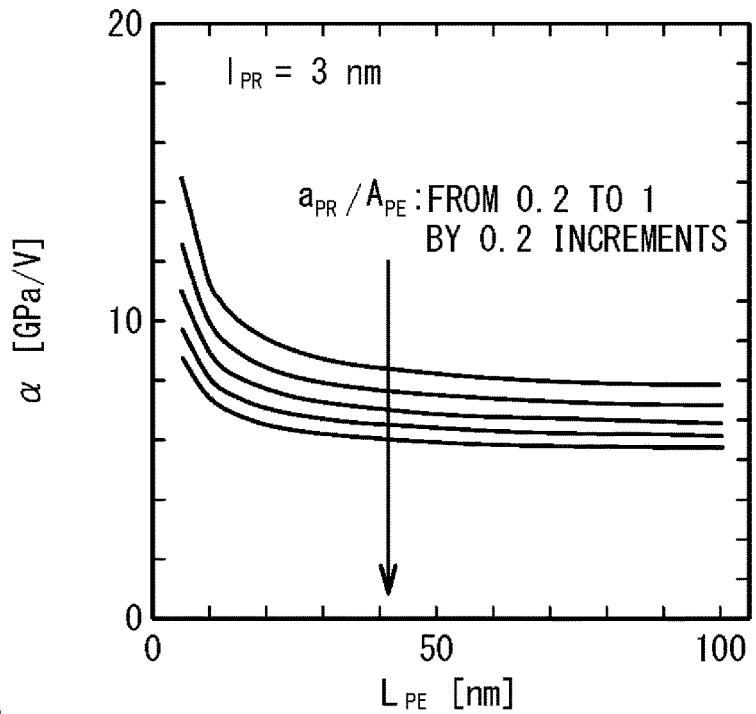
FIG. 7A and FIG. 7B are graphs of $\alpha$ versus $L_{PE}$ in the first embodiment and the first comparative example, respectively.
Figure 7B:
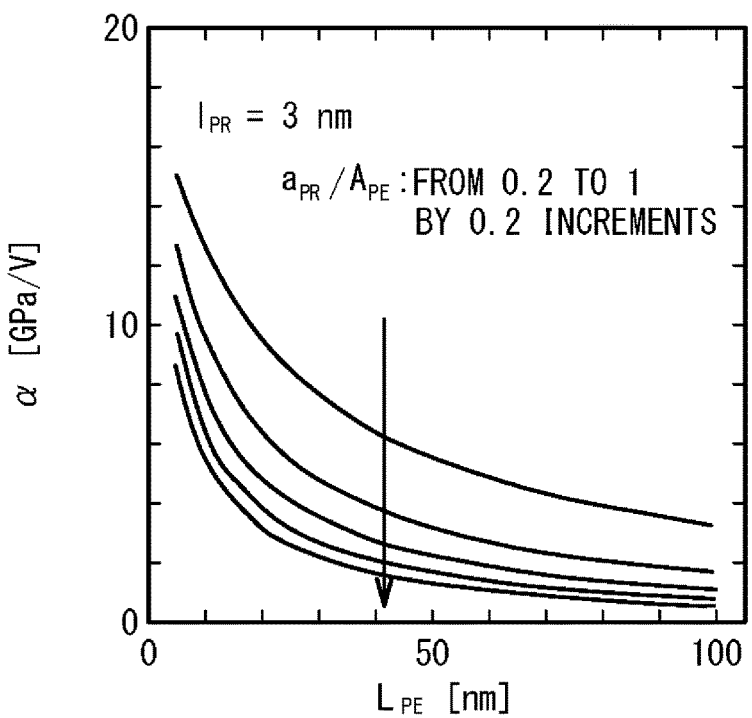

FIG. 7A and FIG. 7B are graphs of α versus $L_{PE}$ in the first embodiment and the first comparative example, respectively. $l_{PR}$ was fixed to 3 nm. Solid lines indicate results at $a_{PR}/A_{PE}$ varied from 0.2 to 1.0 by 0.2 increments in the direction indicated by the arrow. The same applies to the drawings for the first embodiment and the first comparative example. As illustrated in FIG. 7A, as $a_{PR}/A_{PE}$ decreases, α increases. α hardly depends on $L_{PE}$. As illustrated in FIG. 7B, as $a_{PR}/A_{PE}$ decreases, α increases. As $L_{PE}$ increases, α decreases.

Figure 8A:
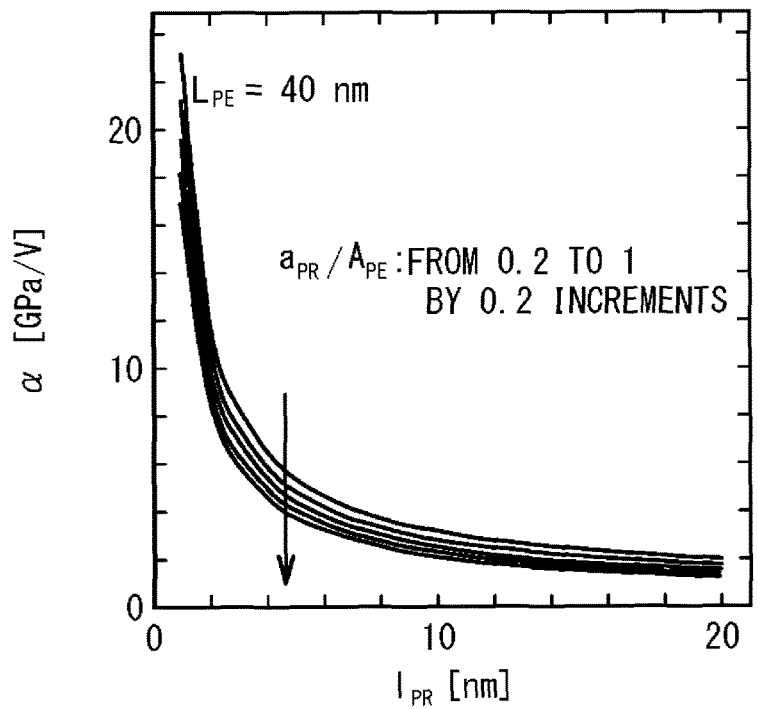
FIG. 8A and FIG. 8B are graphs of $\alpha$ versus $l_{PR}$ in the first embodiment and the first comparative example, respectively.
Figure 8B:
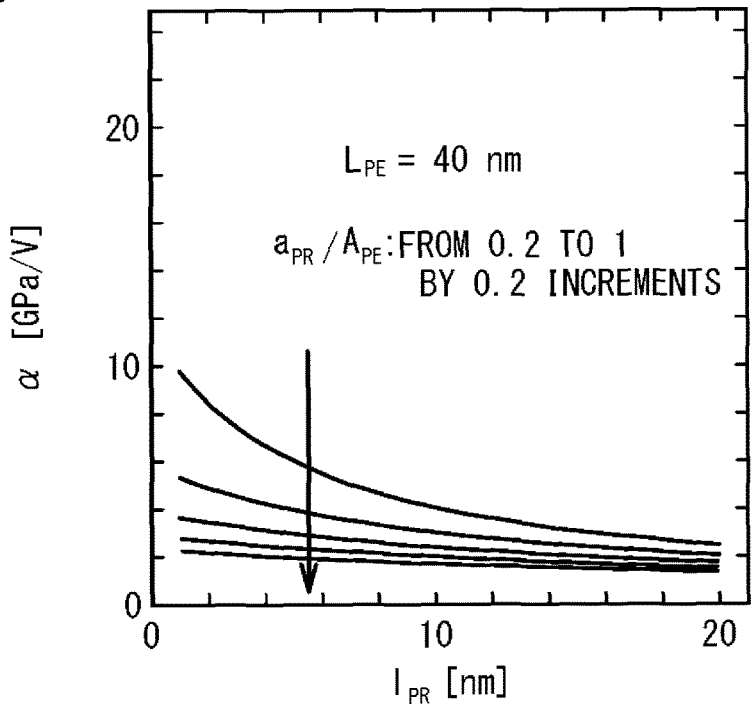

FIG. 8A and FIG. 8B are graphs of α versus $l_{PR}$ in the first embodiment and the first comparative example, respectively. $L_{PE}$ was fixed to 40 nm. As illustrated in FIG. 8A, as $a_{PR}/A_{PE}$ decreases, α increases. As $l_{PR}$ decreases, α increases. As illustrated in FIG. 8B, as $a_{PR}/A_{PE}$ decreases, α increases. As $l_{PR}$ decreases, α increases.

When FIG. 7A and FIG. 8A are compared with FIG. 7B and FIG. 8B, α of the first embodiment is two times greater than α of the first comparative example in the case of, for example, $L_{PE}=40$ nm, $l_{PR}=3$ nm, and $a_{PR}/A_{PE}=0.4$. This result reveals that the first embodiment can apply a pressure to the piezoresistor 10 more efficiently than the first comparative example. Thus, the first embodiment can enhance a current-driving performance.

Figure 9A:
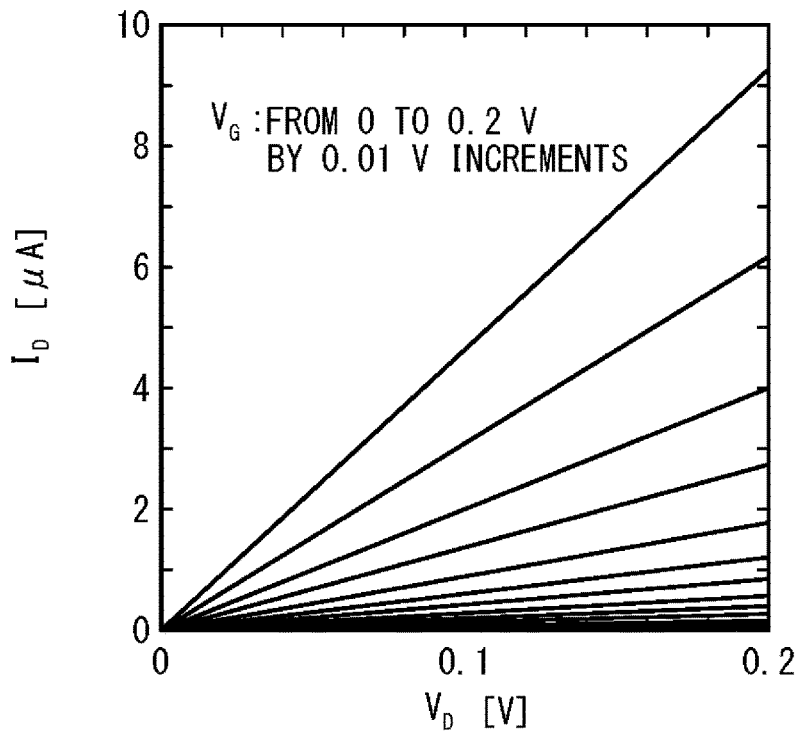
FIG. 9A and FIG. 9B are graphs of drain current $I_D$ versus drain voltage $V_D$ in the first embodiment and the first comparative example, respectively.
Figure 9B:
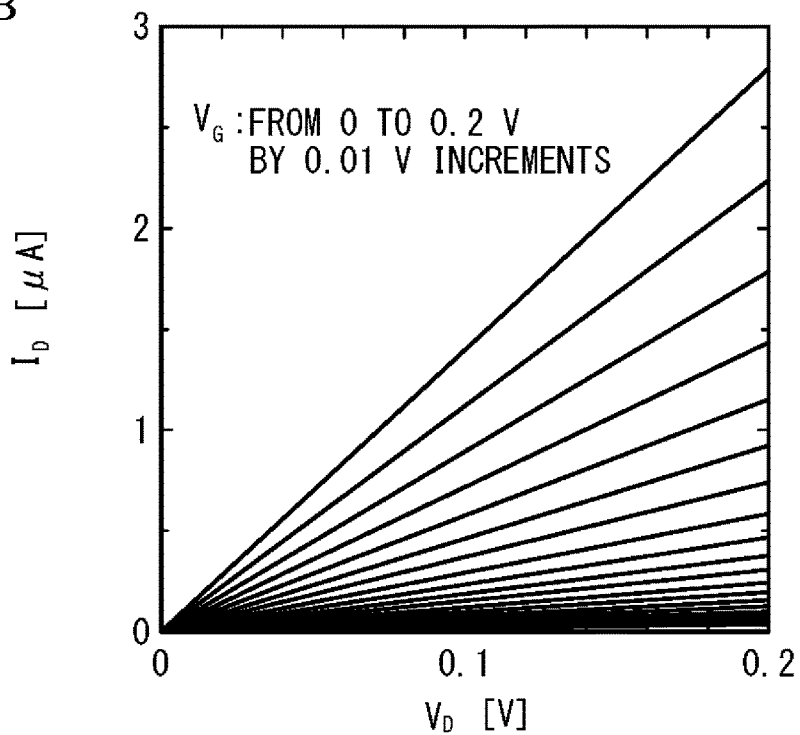

FIG. 9A and FIG. 9B are graphs of drain current $I_D$ versus drain voltage $V_D$ in the first embodiment and the first comparative example, respectively. In the first embodiment, $l_{PR}=3$ nm, $L_{PE}=40$ nm, $h_{PR}=12$ nm, $H_{PE}=30$ nm, and $a_{PR}/A_{PE}=0.4$. In the first comparative example, $l_{PR}=3$ nm, $L_{PE}=40$ nm, $a_{PR}=100$ nm$^2$, $A_{PE}=250$ nm$^2$, and $a_{PR}/A_{PE}=0.4$. The solid lines indicate results when the gate voltage $V_G$ from 0 V to 0.2 V by 0.01 V increments is applied.

As illustrated in FIG. 9A and FIG. 9B, the drain current $I_D$ of the first embodiment is three times greater than that of the first comparative example. This result reveals that the first embodiment has a current-driving performance three times greater than that of the first comparative example.

Next, a sub-threshold slope S was calculated. When the sub-threshold slope S is small, the leak current is small when the piezoresistor 10 is turned off by the gate 18.

Figure 10A:
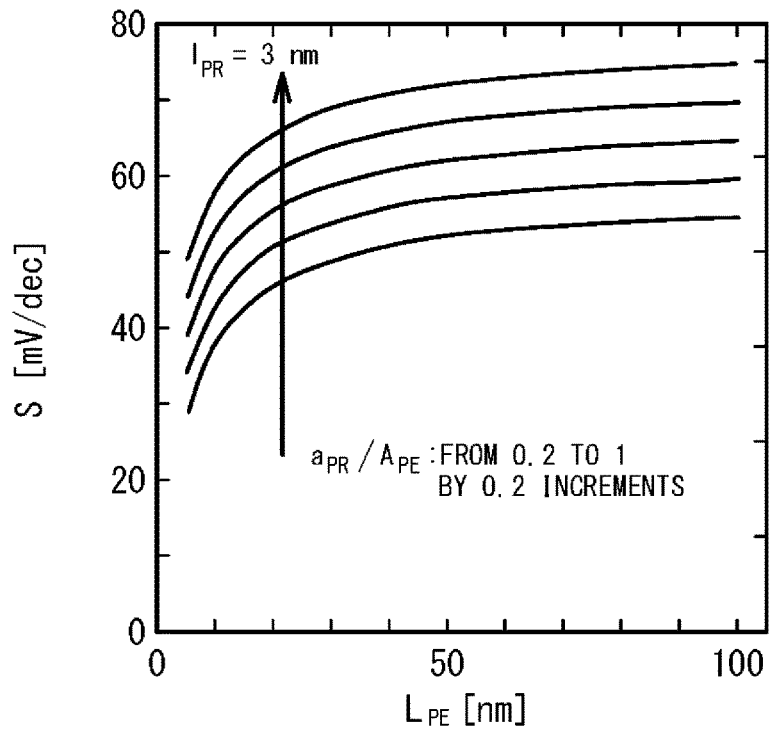
FIG. 10A and FIG. 10B are graphs of S versus $L_{PE}$ in the first embodiment and the first comparative example, respectively.
Figure 10B:
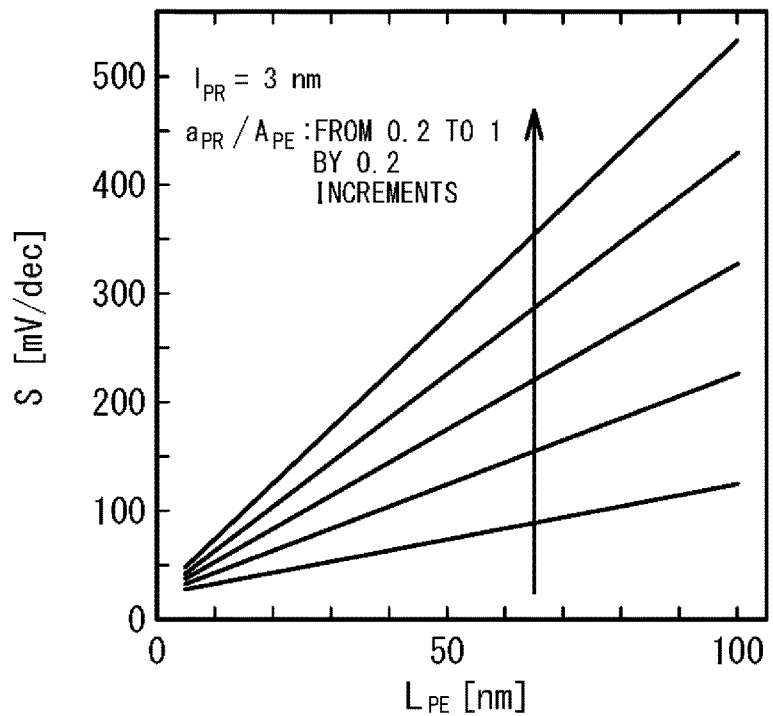

FIG. 10A and FIG. 10B are graphs of S versus $L_{PE}$ in the first embodiment and the first comparative example, respectively. $l_{PR}$ was fixed to 3 nm. As illustrated in FIG. 10A, as $a_{PR}/A_{PE}$ decreases, S decreases. S decreases as $L_{PE}$ decreases. As illustrated in FIG. 10B, as $a_{PR}/A_{PE}$ decreases, S decreases. As $L_{PE}$ decreases, S decreases.

Figure 11A:
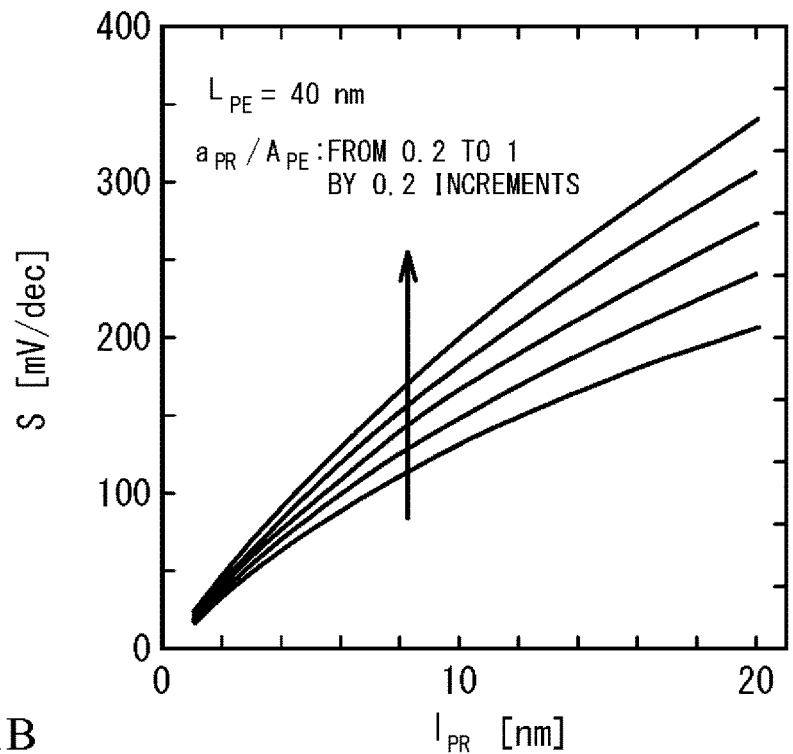
FIG. 11A and FIG. 11B are graphs of S versus $l_{PR}$ in the first embodiment and the first comparative example, respectively.
Figure 11B:
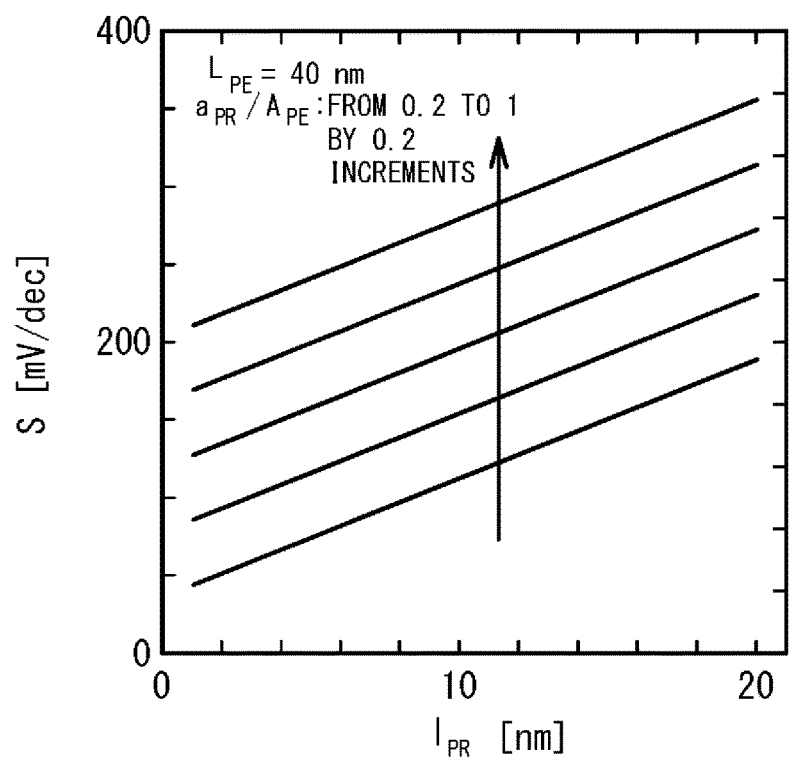

FIG. 11A and FIG. 11B are graphs of S versus $l_{PR}$ in the first embodiment and the first comparative example, respectively. $L_{PE}$ was fixed to 40 nm. As illustrated in FIG. 11A, as $a_{PR}/A_{PE}$ decreases, S decreases. As $l_{PR}$ decreases, S decreases. As illustrated in FIG. 11B, as $a_{PR}/A_{PE}$ decreases, S decreases. As $l_{PR}$ decreases, S decreases.

When FIG. 10A and FIG. 11A are compared with FIG. 10B and FIG. 11B, in the case of, for example, $L_{PE}=40$ nm, $l_{PR}=3$ nm, and $a_{PR}/A_{PE}=0.4$, S of the first embodiment is approximately 50, which is below the limit value (60 mV/decade) of a MOSFET at room temperature, compared with the first comparative example. In contrast, S of the first comparative example is approximately 100, which is approximately two times greater than S of the first embodiment. As seen above, the first embodiment can make the sub-threshold characteristic steeper than the first comparative example. Thus, the first embodiment can reduce the leak current at the time of off.

In terms of α and S, $a_{PR}/A_{PE}$ is preferably small. For example, $a_{PR}/A_{PE}$ is preferably less than one, more preferably equal to or less than approximately 0.6.

Figure 12A:
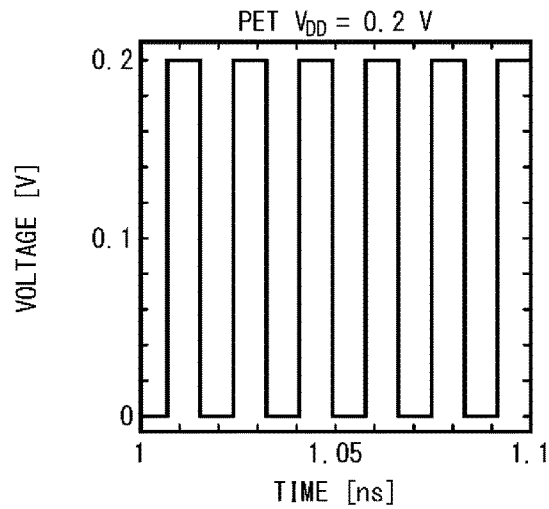
FIG. 12A through FIG. 12C are graphs of output voltage of a ring oscillator versus time.
Figure 12B:
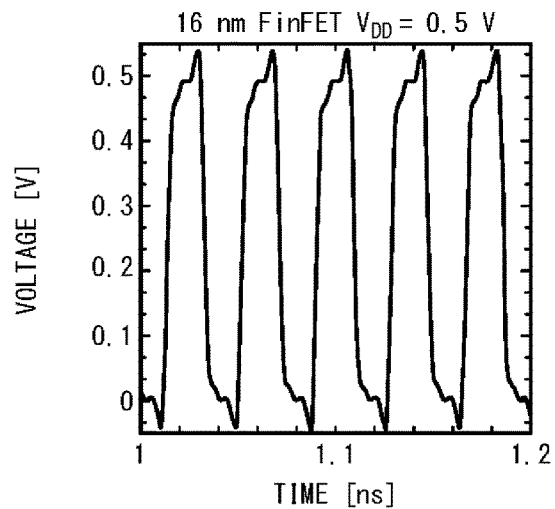
Figure 12C:
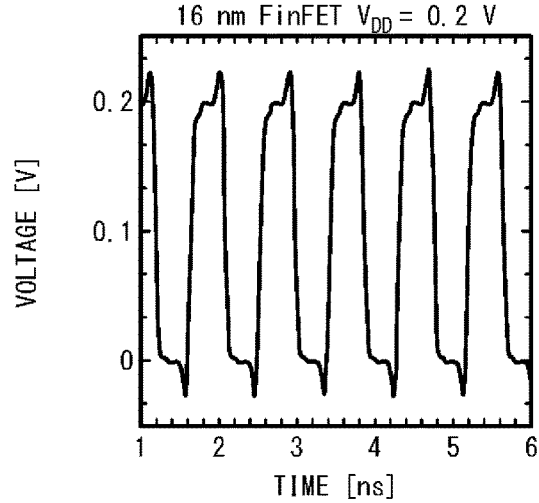

Next, calculated was the oscillation frequency of a ring oscillator composed of a five-stage inverter. The inverter was assumed to be a complementary inverter using a p channel PET and an n channel PET. FIG. 12A through FIG. 12C are graphs of output voltage of the ring oscillator versus time. FIG. 12A illustrates the calculation result of the PET of the first embodiment. The PET used for calculation was configured as $l_{PR}$=3 nm, $L_{PE}$=10 nm, $h_{PR}$=6 nm, $H_{PE}$=30 nm, and $a_{PR}/A_{PE}$=0.2. The power-supply voltage $V_{DD}$ is equal to 0.2 V. Mechanical resonance phenomenon responding the voltage application to the piezoelectric material 12 affects the oscillation frequency of the ring oscillator. Thus, the calculation taking this effect into consideration was performed. FIG. 12B and FIG. 12C illustrate the calculation results when a 16 nm node FinFE is used. FIG. 12B shows the case of the power-supply voltage $V_{DD}$=0.5V, and FIG. 12C shows the case of the power-supply voltage $V_{DD}$=0.2 V.

As illustrated in FIG. 12A, in the first embodiment, the oscillation frequency is approximately 60 GHz even when $V_{DD}$ is equal to 0.2V. As illustrated in FIG. 12B, in the FinFET, the oscillation frequency is approximately 25 GHz when $V_{DD}$ is equal to 0.5 V. As illustrated in FIG. 12C, the oscillation frequency is approximately 1.3 GHz when $V_{DD}$ is equal to 0.2 V. As described above, even when a FinFET, which is one of the transistors currently having the fastest operation speed, is used, the operation speed rapidly degrades as $V_{DD}$ decreases. In contrast, as the first embodiment has a current-driving performance, the oscillation frequency remains high even when $V_{DD}$ is decreased. The optimization of the structure may achieve an oscillation frequency of approximately 100 GHz at $V_{DD}$ of 0.2 V.

In the first embodiment, the piezoelectric material 12 is located so as to surround the piezoresistor 10. Applying a voltage to the gate 18 causes the piezoelectric material 12 to apply a pressure to the piezoresistor 10. Accordingly, compared to the first comparative example, the first embodiment does not need to use a support structure. In addition, as illustrated in FIG. 7A through FIG. 8B, compared to the first comparative example, the first embodiment can highly efficiently apply a pressure to the piezoresistor 10. Thus, the first embodiment can enhance a current-driving performance. Furthermore, as illustrated in FIG. 10A through FIG. 11B, compared to the first comparative example, the first embodiment can improve the sub-threshold characteristic. The piezoresistor 10 transitions into a metallic phase by pressure, and thus has a very low on resistance. Accordingly, the high speed operation can be achieved even at a low power-supply voltage (for example, 0.2 V or less) as illustrated in FIG. 12A.

In addition, in the first comparative example, the gate 18, the source 14, and the drain 16 are stacked in this order as illustrated in FIG. 1. Thus, the case where carriers are conducted from the source 14 to the drain 16 is inequivalent to the case where carriers are conducted from the drain 16 to the source 14 (currents differ from each other). As described above, the source 14 and the drain 16 are asymmetrical to each other with respect to the gate 18. Accordingly, to obtain the same characteristic by switching between the source 14 and the drain 16, the voltage applied to the gate 18 needs to be changed. Thus, when the source 14 and the drain 16 are switched, the characteristics greatly change.

In contrast, in the first embodiment, the device structure can be configured so that the source 14 and the drain 16 are symmetrical to each other across the channel center. In addition, the source 14 and the drain 16 have equivalent structures with respect to the gate 18. Thus, even when the source 14 and the drain 16 are switched, the same characteristic can be obtained by applying the same voltage to the gate 18. As described above, the characteristics hardly change even when the source 14 and the drain 16 are switched.

Second Embodiment

Figure 13A:
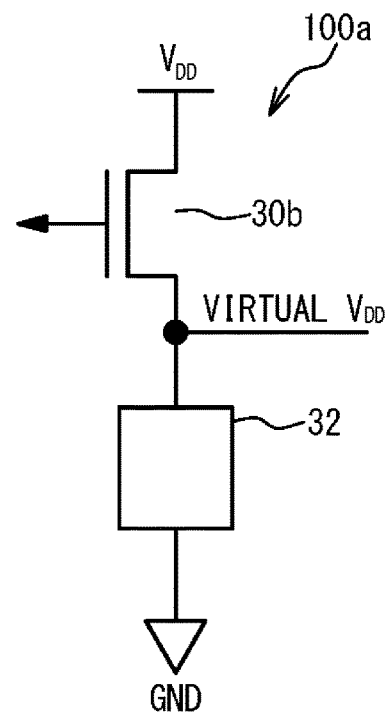
FIG. 13A and FIG. 13B are block diagrams of electronic circuits in accordance with a second embodiment.
Figure 13B:
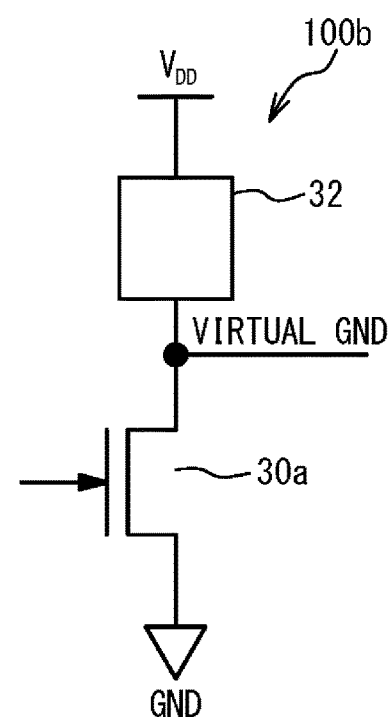

A second embodiment is an exemplary power gating circuit using the PET of the first embodiment as a power switch. FIG. 13A and FIG. 13B are block diagrams of electronic circuits in accordance with the second embodiment. As illustrated in FIG. 13A, a power gating circuit 100a includes a p channel PET 30b as a power switch and a power domain circuit 32. The power domain circuit 32 is located between two power sources: a ground GND and a power source $V_{DD}$. The power domain circuit 32 is supplied with electric power from the ground GND and the power source $V_{DD}$. The p channel PET 30b is located between the circuit 32 and the power source $V_{DD}$. The source of the PET 30b is coupled to the power source $V_{DD}$, and the drain is coupled to the circuit 32. Signals controlling electric power to be supplied to the circuit 32 are input to the gate. A node between the PET 30b and the circuit 32 is a virtual $V_{DD}$. Applied to the circuit 32 is the voltage corresponding to the difference in electric potential between the virtual $V_{DD}$ and the ground GND.

As illustrated in FIG. 13B, a power gating circuit 100b includes an n channel PET 30a as a power switch and the power domain circuit 32. The n channel PET 30a is located between the ground GND and the circuit 32. The source of the PET 30a is coupled to the ground GND, and the drain is coupled to the circuit 32. Input to the gate are signals controlling electric power to be supplied to the circuit 32. A node between the PET 30a and the circuit 32 is a virtual GND. Applied to the circuit 32 is the voltage corresponding to the difference in electric potential between the power source $V_{DD}$ and the virtual GND. The PETs 30a and 30b are the transistor of the first embodiment.

In the second embodiment, the circuit 32 is connected between the power source $V_{DD}$ (a first power source) and the ground GND (a second power source). The source of the PET 30a or 30b, which is a power switch, is coupled to the power source $V_{DD}$ or the ground GND, and the drain is coupled to the circuit 32. Input to the gate is a signal cutting the electric power supplied to the circuit 32. This signal is a signal that turns on or off the PET 30a or 30b.

As described above, the power gating circuit of the second embodiment uses the PET 30a or 30b as the power switch of a power domain circuit. The PET 30a or 30b has a metallically-low on resistance. Thus, the decrease in voltage in the power switch can be significantly reduced. Therefore, the voltage capable of being applied to the power domain circuit 32 (the potential difference between the virtual power source $V_{DD}$ and the ground GND in FIG. 13A, the potential difference between the power source $V_{DD}$ and the virtual ground GND in FIG. 13B) can be easily increased. Thus, the circuit performance of the power domain circuit 32 can be maintained high. Therefore, the second embodiment can achieve a high circuit performance compared to a circuit using a typical MOSFET as a power switch. In addition, the cutoff characteristics due to the steep sub-threshold characteristic and the large on/off ratio of the PET 30a or 30b can concentrate the decrease in voltage on the power switch when the power is cut off. Thus, the second embodiment can reduce the leak of the power domain circuit 32 when the power is cut off. Furthermore, when the PET 30a or 30b is formed in a multilayered wiring layer, the area overhead for the power switch can be almost eliminated. The power domain circuit 32 can be composed of a typical CMOS or a PET (including a complementary PET).

Third Embodiment

Figure 14:
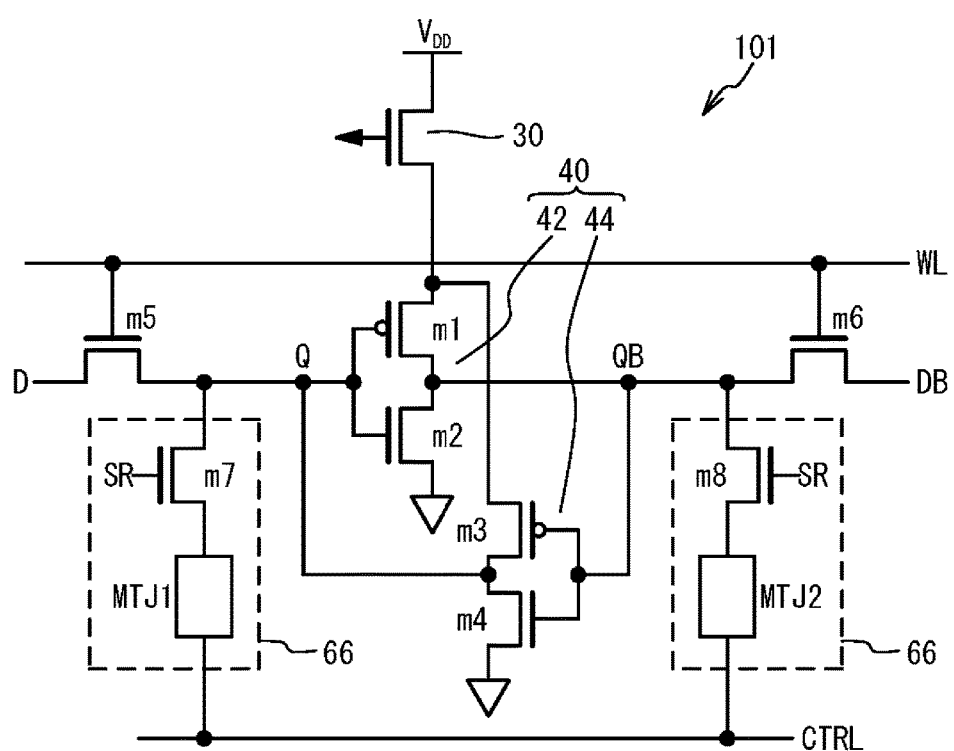
FIG. 14 is a circuit diagram of an electronic circuit in accordance with a third embodiment.

A third embodiment uses the PET of the first embodiment as a power switch of a non-volatile bistable circuit. FIG. 14 is a circuit diagram of an electronic circuit in accordance with the third embodiment. As illustrated in FIG. 14, a memory cell 101 includes a bistable circuit 40 and non-volatile elements MTJ1 and MTJ2 (non-volatile memory elements). The bistable circuit 40 stores data in a volatile manner. The non-volatile elements MTJ1 and MTJ2 store, in a non-volatile manner, data stored in the bistable circuit 40, and restores the data stored in a non-volatile manner to the bistable circuit 40. The non-volatile elements MTJ1 and MTJ2 are, for example, ferromagnetic tunnel junction elements.

The bistable circuit 40 includes inverters 42 and 44. The inverter 42 includes a p channel FET m1 and an n channel FET m2. The inverter 44 includes a p channel FET m3 and an n channel FET m4. The inverters 42 and 44 are connected in a ring shape. The bistable circuit 40 is connected between the power source $V_{DD}$ and a ground. The power source $V_{DD}$ is coupled to the sources of the FETs m1 and m3, and the ground is coupled to the sources of the FETs m2 and m4. A (p channel) PET 30, which is a power switch, is connected in series between the sources of the FETs m1 and m3 and the power source $V_{DD}$. Turning off the PET 30 can cut the electric power supplied to the bistable circuit 40.

Nodes connecting to the inverters 42 and 44 are respectively nodes Q and QB. The node Q and the node QB are nodes complementing each other. The node Q is coupled to an input-output line D through an FET m5, and the node QB is coupled to an input-output line DB through an FET m6. The gates of the FETs m5 and m6 are coupled to a word line WL. Data is written in and read out from the bistable circuit 40 in the same way as the conventional SRAM.

In a path 66 between the node Q and a control line CTRL, an (n channel) FET m7 and the non-volatile element MTJ1 are connected in series, while in the path 66 between the node QB and the control line CTRL, an (n channel) FET m8 and the non-volatile element MTJ2 are connected in series. One of the source and the drain of the FET m7 is coupled to the node Q, and the other of the source and the drain is coupled to the non-volatile element MTJ1. One of the source and the drain of the FET m8 is coupled to the node QB, and the other of the source and the drain is coupled to the non-volatile element MTJ2. The gates of the FETs m7 and m8 are coupled to a switch line SR. The FET m7 may be connected between the non-volatile element MTJ1 and the control line CTRL, and the FET m8 may be connected between the non-volatile element MTJ2 and the control line CTRL.

Data is stored from the bistable circuit 40 to the non-volatile elements MTJ1 and MTJ2 by changing the control line CTRL to a high level and a low level while keeping the FETs m7 and m8 turned on. The PET 30 is turned off after data is stored in the non-volatile elements MTJ1 and MTJ2. This operation can reduce the power consumption because the electric power is not supplied to the bistable circuit 40.

The data is restored from the non-volatile elements MTJ1 and MTJ2 to the bistable circuit 40 by turning on the PET 30 to supply the electrical power to the bistable circuit 40 while maintaining the control line CTRL at a low level.

In the third embodiment, the non-volatile elements MTJ1 and MTJ2 may be giant magnetoresistance (GMR) elements, variable resistance elements used in a Resistance Random Access Memory (ReRAM), or phase-change elements used in a Phase change RAM (PRAM) instead of ferromagnetic tunnel junction elements. Moreover, the PET 30, which is a power switch, may be located between a ground and the bistable circuit 40 as illustrated in FIG. 13B of the second embodiment. In this case, the PET is an n channel PET, and the FETs m7 and m8 are p channel FETs. Furthermore, the number of the non-volatile element may be one, and the non-volatile element may be connected between one node of the bistable circuit 40 and the control line.

Figure 15:
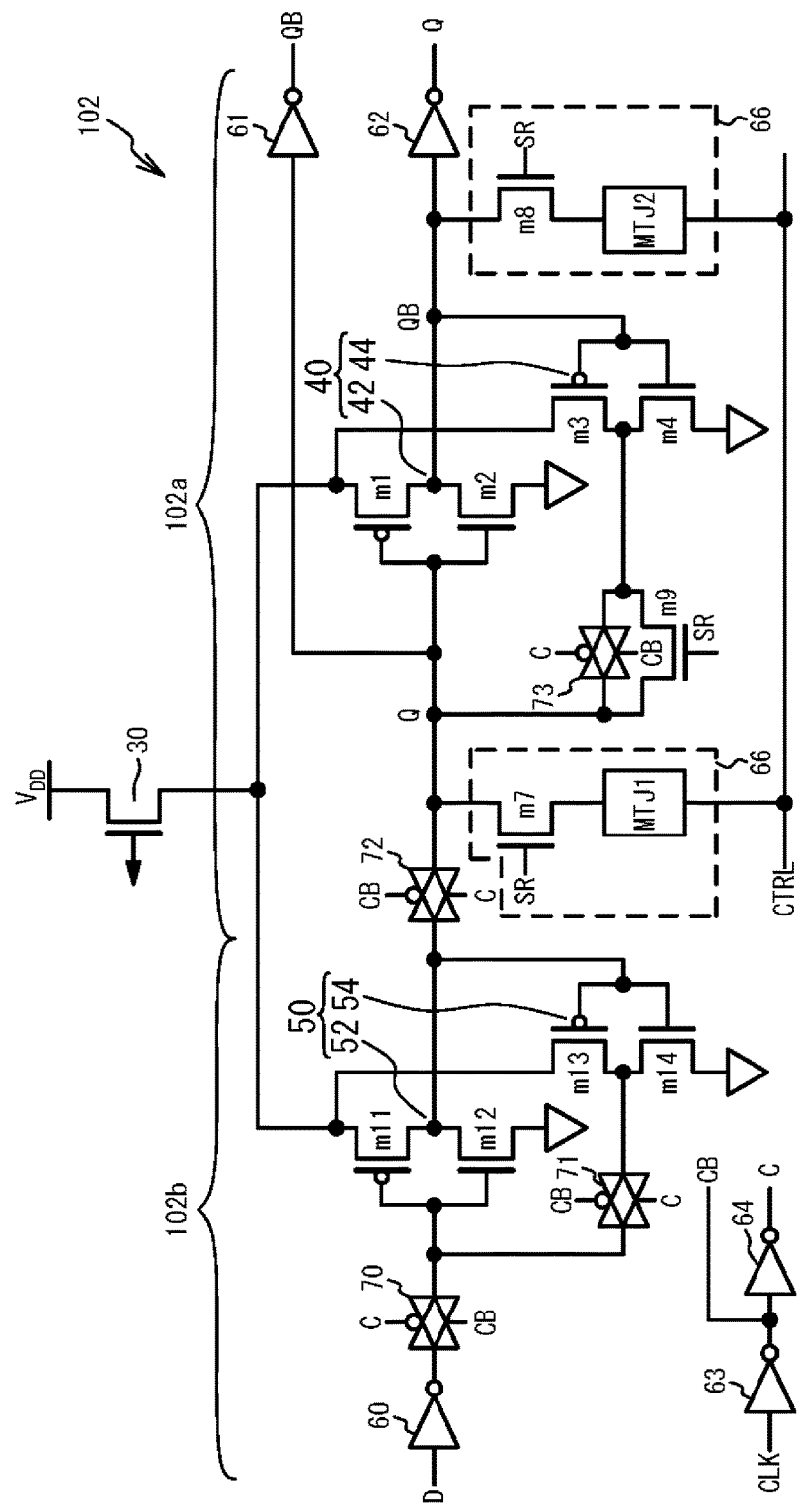
FIG. 15 is a circuit diagram of an electronic circuit in accordance with a variation of the third embodiment.

A variation of the third embodiment describes an exemplary master-slave type flip-flop circuit. FIG. 15 is a circuit diagram of an electronic circuit in accordance with the variation of the third embodiment. As illustrated in FIG. 15, a memory circuit 102 includes a D-latch circuit 102a and a D-latch circuit 102b. The D-latch circuit 102a includes the bistable circuit 40, pass gates 72 and 73, the non-volatile elements MTJ1 and MTJ2, and FETs m7 through m9. The pass gate 73 and the FET m9 are connected in parallel in the ring of the bistable circuit 40. The (n channel) FET m7 and the non-volatile element MTJ1 are connected in series between the node Q in the bistable circuit 40 and the control line CTRL. The (n channel) FET m8 and the non-volatile element MTJ2 are connected in series between the node QB in the bistable circuit 40 and the control line CTR. The node Q becomes a QB signal through an inverter 61. The node QB becomes a Q signal through an inverter 62. The node Q is coupled to the D-latch circuit 102b through the pass gate 72.

The D-latch circuit 102b includes a bistable circuit 50 and pass gates 70 and 71. The bistable circuit 50 includes inverters 52 and 54 connected in a ring shape. The inverter 52 includes a p channel FET m11 and an n channel FET m12. The inverter 54 includes a p channel FET m13 and an n channel FET m14. The pass gate 71 is connected in the ring of the bistable circuit 50. Data D is input to the bistable circuit 50 through an inverter 60 and the pass gate 70. A clock signal CLK becomes a clock CB through an inverter 63, and then becomes a clock C through an inverter 64. The clocks CB and C are input to the pass gates 70 through 73. The (p channel) PET 30 as a power switch is connected between the bistable circuits 40 and 50 and the power source $V_{DD}$.

In the variation of the third embodiment, the non-volatile elements MTJ1 and MTJ2 may be GMR elements, variable resistance elements used in a ReRAM, or phase-change elements used in a PRAM instead of ferromagnetic tunnel junction elements. The PET 30, which is a power switch, may be located between a ground and the bistable circuit 40. In this case, the PET is an n channel PET, and the FETs m7 and m8 are p channel FETs. Furthermore, the number of the non-volatile element may be one, and the non-volatile element may be connected between one node of the bistable circuit 40 and the control line.

The problem caused by using a MOSFET as a power switch corresponding to the PET 30 illustrated in FIG. 14 and FIG. 15 will be described. At the time of storing operation, current flows through the non-volatile element MTJ1 or MTJ2. Thus, the impedance between the power source $V_{DD}$ and a ground greatly decreases. Thus, if a MOSFET is used as a power switch, the decrease in voltage in the MOSFET increases. Accordingly, a sufficient voltage is not applied to the bistable circuit 40 or the non-volatile elements MTJ1 and MTJ2. This makes the stable operation difficult. Therefore, when a typical MOSFET is used as a power switch, the use of a MOSFET with a large channel width (or a plurality of MOSFETs) is required to apply a sufficient voltage to the memory cell. This requirement increases the cell area, complicates the layout, deteriorates the performance, and raises other problems (because a sufficiently large power switch cannot be used because of the limitation to the cell area in practice).

In contrast, the third embodiment and the variation thereof use the PET 30 of the first embodiment as a power switch. Since the current-driving performance of the PET 30 is very high compared to MOSFETs (including high-performance transistors such as FinFETs), the decrease in voltage due to the power switch can be easily reduced even though a sufficiently small PET is used. Therefore, even when the power switch is introduced, the stable operation of the memory cell can be easily achieved. Accordingly, the use of the PET 30 as a power switch allows for power gating of a non-volatile bistable circuit without increasing the cell area, complicating the layout, and deteriorating the performance (the PET can be formed in the multilayered wiring layer).

As described in the third embodiment and the variation thereof, in the non-volatile bistable circuit that includes a non-volatile element storing data of the bistable circuit 40 in a non-volatile manner, the PET 30 is used for a power switch supplying electric power to the bistable circuit 40. This configuration allows for power gating of the non-volatile bistable circuit without increasing the cell area, complicating the layout, and deteriorating the performance. In addition, since the leak current when the PET 30 is turned off is small, standby power consumption when the bistable circuit 40 is shut off can be reduced.

In the third embodiment and the variation thereof, the FETs m1 through m14 may be MOSFETs or PETs. Large current flows through the path 66 at the time of storing operation. Thus, the use of PETs as the FETs m7 and m8 allows for the storing operation at a low voltage. When the FETs m7 and m8 are PETs, the structure of a fourth embodiment illustrated in FIG. 16B, which will be described later, may be employed. In addition, one or more PETs can constitute power switches of a plurality of non-volatile memories. For example, less PETs than non-volatile memory cells can constitute the power switches.

Fourth Embodiment

Figure 16A:
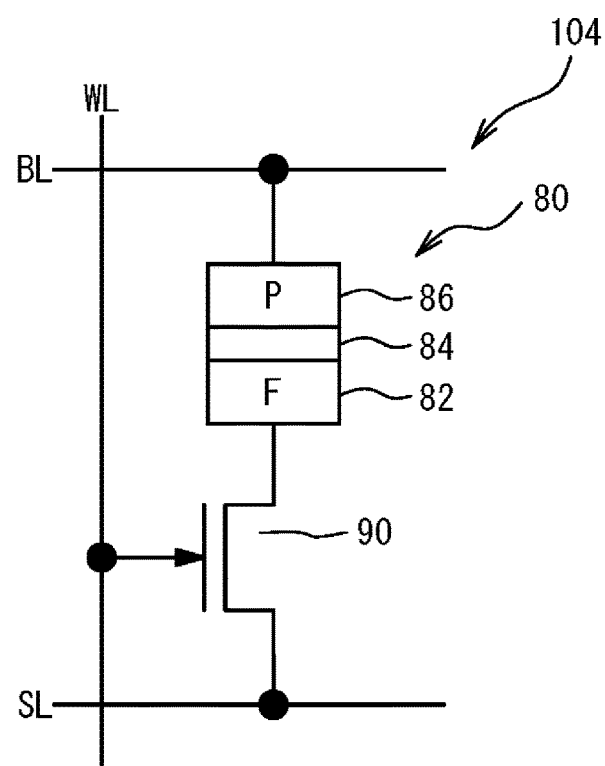
FIG. 16A is a circuit diagram of a non-volatile memory cell in accordance with a fourth embodiment.
Figure 16B:
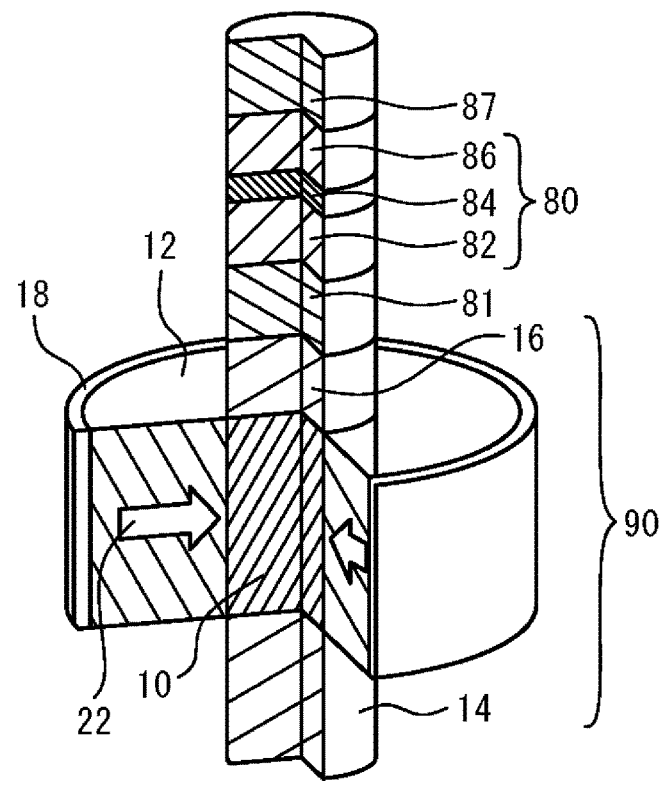
FIG. 16B is a perspective cross-sectional view.

The fourth embodiment uses a PET for a non-volatile memory cell. FIG. 16A is a circuit diagram of a non-volatile memory cell in accordance with the fourth embodiment, and FIG. 16B is a cross-section perspective view. As illustrated in FIG. 16A, a non-volatile memory cell 104 includes a non-volatile element 80 and a PET 90. The non-volatile element 80 and the source and the drain of the PET 90 are connected in series between a source line SL and a bit line BL. The gate of the PET 90 is coupled to the word line WL.

The non-volatile element 80 includes a non-magnetism layer 84 located between a free layer 82 made of a ferromagnetic metal and a pin layer 86. In a ferromagnetic tunnel junction element, the non-magnetism layer 84 is a tunnel insulating film. In a giant magnetoresistance (GMR) element, the non-magnetism layer 84 is a metal layer. The free layer 82 and the pin layer 86 may be switched.

As illustrated in FIG. 16B, on the drain 16 of the PET 90, stacked are a metal layer 81, the free layer 82, the non-magnetism layer 84, the pin layer 86, and a metal layer 87 in this order. As described above, the non-volatile element 80 may be stacked on the PET 90.

A current flows when data is rewritten in the current-driven non-volatile element 80 such as a ferromagnetic tunnel junction element of pin transfer torque magnetic reversal type. Thus, as described in the fourth embodiment, the PET 90 and the non-volatile element 80 constitute the non-volatile memory cell 104. This configuration can provide a non-volatile memory cell capable of operating at a low voltage such as, for example, 0.5 V or less. This is because the on resistance of the PET 90 is low and the current sufficient to rewrite data can be driven even during low voltage driving. The use of a GMR element having a ferromagnetic metal/non-magnetism metal/ferromagnetic metal structure with lower resistance can provide a non-volatile memory cell capable of being driven at lower voltage. The non-volatile element 80 may be a variable resistance element used in a ReRAM, or a phase-change element used in a PRAM instead of a ferromagnetic tunnel junction element and a giant magnetoresistance (GMR) element.

Fifth Embodiment

Figure 17A:
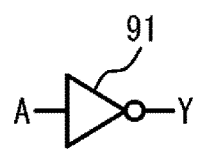
FIG. 17A through FIG. 17F are circuit diagrams (No. 1) of electronic circuits in accordance with a fifth embodiment.
Figure 17B:
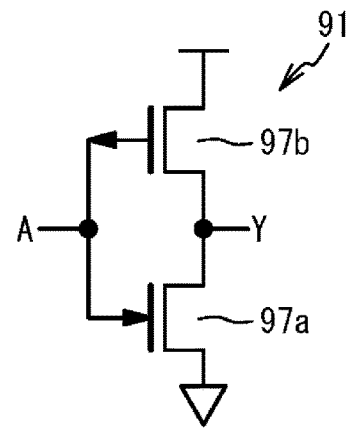
Figure 17C:
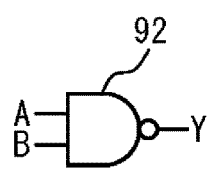
Figure 17D:
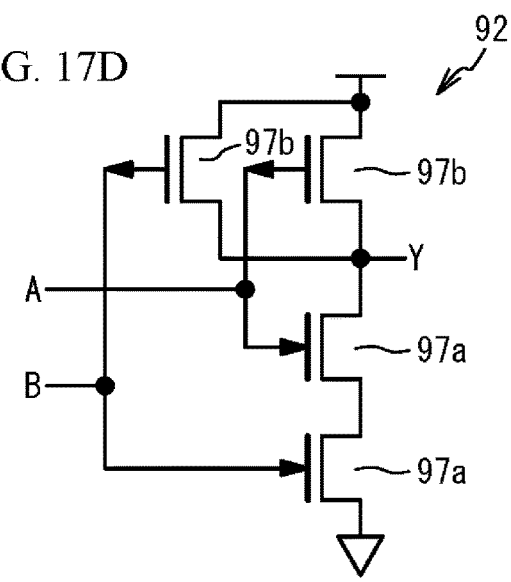
Figure 17E:
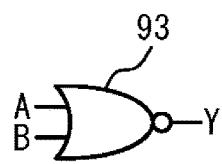
Figure 17F:
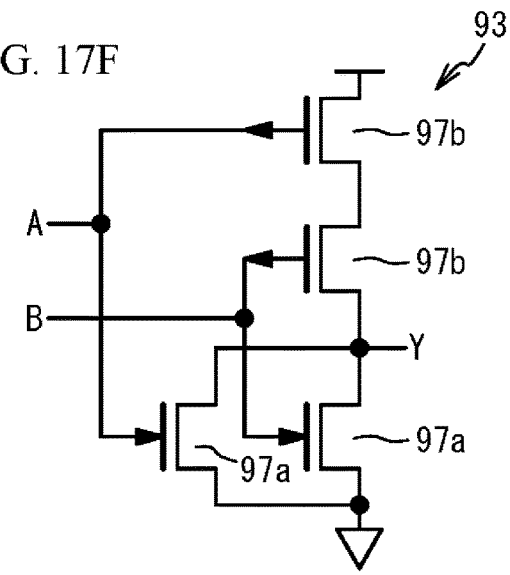

A fifth embodiment uses PETs for a logic circuit. FIG. 17A through FIG. 18F are circuit diagrams of electronic circuits in accordance with the fifth embodiment. As illustrated in FIG. 17A and FIG. 17B, an inverter circuit 91 that outputs inversion (NOT) signal Y of signal A can be composed of one n channel PET 97a and one p channel PET 97b. As illustrated in FIG. 17C and FIG. 17D, a NAND circuit 92 that outputs inverted AND (NAND) signal Y of signals A and B can be composed of two n channel PETs 97a and two p channel PETs 97b. As illustrated in FIG. 17E and FIG. 17F, an NOR circuit 93 that outputs negative OR (NOR) signal Y of signals A and B can be composed of two n channel PETs 97a and two p channel PETs 97b.

Figure 18A:
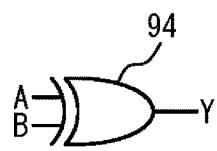
FIG. 18A through FIG. 18F are circuit diagrams (No. 2) of electronic circuits in accordance with the fifth embodiment.
Figure 18B:
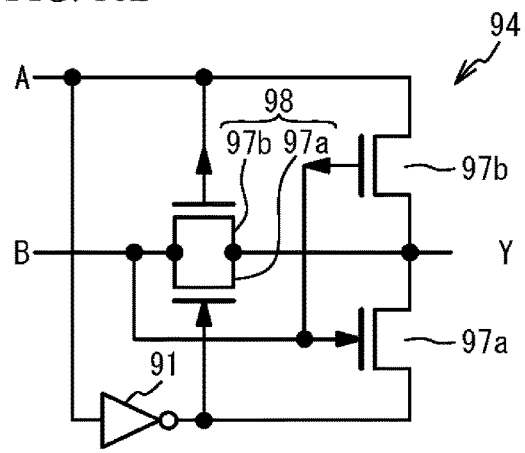
Figure 18C:
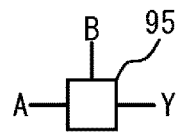
Figure 18D:
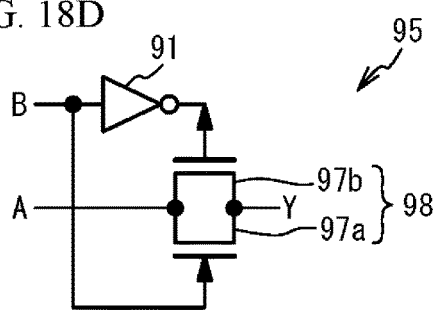
Figure 18E:
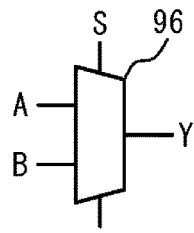
Figure 18F:
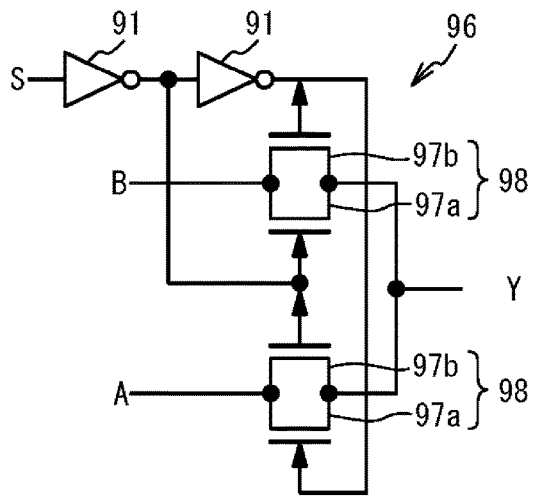

As illustrated in FIG. 18A and FIG. 18B, an XOR circuit 94 that outputs exclusive OR (XOR) signal Y of signals A and B can be composed of one n channel PET 97a, one p channel PET 97b, the inverter circuit 91, and a pass gate 98. The pass gate 98 can be composed of the n channel PET 97a and the p channel PET 97b. As illustrated FIG. 18C and FIG. 18D, a circuit 95 that synchronizes signal A with signal B and outputs the resulting signal as signal Y can be composed of the inverter circuit 91 and the pass gate 98. As illustrated in FIG. 18E and FIG. 18F, a circuit 96 that synchronizes signals A and B with signal S and sequentially outputs the resulting signals as signal Y can be composed of two inverter circuits 91 and two pass gates 98.

In the logic circuits in accordance with the fifth embodiment, the dielectric polarization directions 22 of the piezoelectric materials 12 in the PETs 97a (a first transistor) and 97b (a second transistor) complementing each other are opposite to each other, and are the direction in which the piezoelectric material 12 applies a pressure to the piezoresistor 10 when a positive voltage with respect to the source 14 is applied to the gate 18 in the PET 97a and the direction in which the piezoelectric material 12 applies a pressure to the piezoresistor 10 when a negative voltage with respect to the source 14 is applied to the gate 18 in the PET 97b. The use of the above described PETs 97a and 97b can achieve the logic same as that of the CMOS logic circuit with the same circuit structure. For example, a NOT circuit, an AND circuit, a NAND circuit, an OR circuit, a NOR circuit, an XOR circuit, an XNOR circuit, the above circuits with multiple inputs (e.g., three-input NAND, three-input NOR, or the like), a composite circuit of the above circuits (e.g., AND-OR-INV (AOI), OR-AND-INV (OAI) or the like), various latch circuits, various flip-flop circuits (e.g., DFF, RSFF, JKFF, TFF, or the like), or circuits such as multiplexers (MUX) can be composed.

In addition, the PETs 97a and 97b can be configured so that the PETs 97a and 97b have identical sizes and ensure the same current. Thus, unlike the CMOS logic circuit, the n channel FET and the p channel FET do not need to have different sizes. Thus, the wiring and the layout when a logic circuit is designed becomes easy, and favorable effects such as the decrease in the occupation area of the circuit and the reduction of the delay of signal transmission are expected.

In the first comparative example, the case where carriers flow from the source 14 to the drain 16 as illustrated in FIG. 1 is inequivalent to the case where carriers flow from the drain 16 to the source 14 (currents differ from each other). In contrast, in the first embodiment, the direction from the source 14 to the drain 16 is equivalent to the direction from the drain 16 to the source 14. Accordingly, the pass gate 98 can be composed with use of the PETs 97a and 97b.

Sixth Embodiment

Figure 19A:
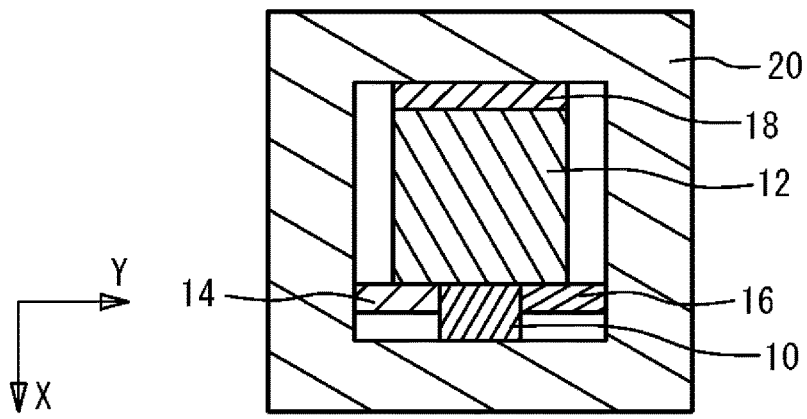
FIG. 19A through FIG. 19C are cross-sectional views of transistors in accordance with a sixth embodiment and variations of the sixth embodiment.
Figure 19B:
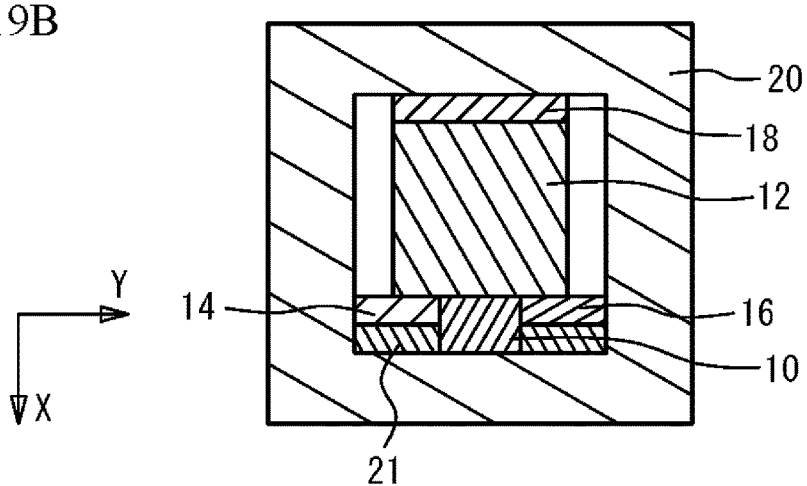
Figure 19C:
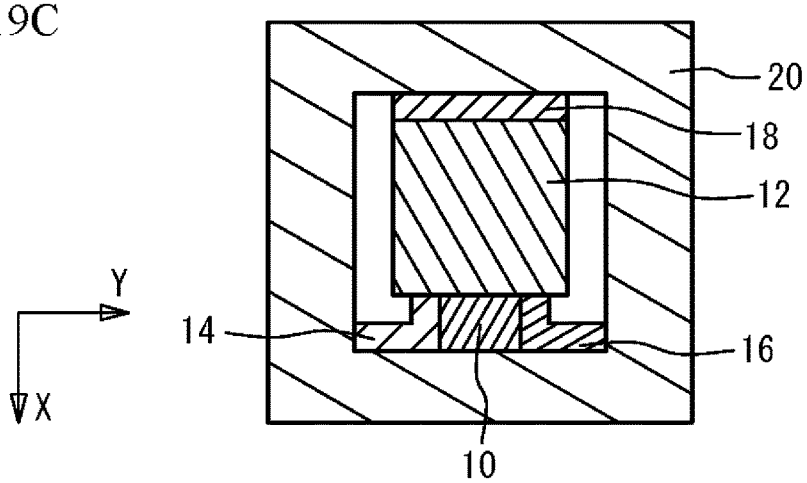

A sixth embodiment is another exemplary PET. FIG. 19A through FIG. 19C are cross-sectional views of transistors in accordance with the sixth embodiment and variations thereof. As illustrated in FIG. 19A, in a PET in accordance with the sixth embodiment, the source 14 is located on a surface of the piezoresistor 10 in the minus y-direction, and the drain 16 is located on a surface of the piezoresistor 10 in the plus y-direction. The piezoelectric material 12 is located on the surface of the piezoresistor 10 in the minus x-direction. The gate 18 is located on the surface of the piezoelectric material 12 in the minus x-direction. The support structure 20 supports the piezoelectric material 12 and the piezoresistor 10. Metal contact layers with small Young's modulus described in the first embodiment may be located between the source 14 and the piezoresistor 10 and between the drain 16 and the piezoresistor 10. The surfaces of the source 14 and the drain 16 opposite from the piezoelectric material 12 (the surfaces in the plus x-direction) may make contact with the support structure 20.

Carriers conduct through the piezoresistor 10 in the y-direction. The piezoelectric material 12 applies a pressure to the piezoresistor 10 in the x-direction. The relationship between the voltage between the source 14 and the gate 18 and the voltage between the drain 16 and the gate 18 is maintained even when the source 14 and the drain 16 are switched. Thus, the current when carriers flow from the source 14 to the drain 16 can be made to be approximately equal to the current when carriers flow from the drain 16 to the source 14. Accordingly, the characteristics of the PET can be made to be equivalent when the source 14 and the drain 16 are switched. Therefore, the PET of the sixth embodiment can be used for, for example, a pass gate or the like.

As illustrated in FIG. 19B, in a PET in accordance with a first variation of the sixth embodiment, a support 21 is located between the source 14 and the support structure 20 and between the drain 16 and the support structure 20. The support 21 is made of resin such as, for example, polyimide, and has Young's modulus less than those of the piezoelectric material 12 and the piezoresistor 10.

In the sixth embodiment illustrated in FIG. 19A, air gaps are formed between the source 14 and the support structure 20 and between the drain 16 and the support structure 20. This configuration makes it difficult to form the source 14 and the drain 16. In addition, the source 14 and the drain 16 are structurally unstable.

In the PET of the first variation of the sixth embodiment illustrated in FIG. 19B, since the support 21 supports the source 14 and the drain 16, the source 14 and the drain 16 are stabilized. When the support 21 has sufficiently small Young's modulus, the pressure from the piezoelectric material 12 is fairly applied to the piezoresistor 10. Moreover, the support 21 may be formed of a porous material such as porous silica, and the support 21 may be collapsed to form the air gap after the source 14 and the drain 16 are formed.

As illustrated in FIG. 19C, in a PET in accordance with a second variation of the sixth embodiment, the source 14 and the drain 16 extend from the surfaces of the piezoresistor 10 in the y-direction and the minus y-direction to the support structure 20. Furthermore, the source 14 and the drain 16 are extracted so as to be supported by the support structure 20. This configuration stabilizes the source 14 and the drain 16. The sixth embodiment and the variations thereof may be applied to the electronic circuits of the second through fifth embodiments. Even when metal contact layers are located between the source 14 and the piezoresistor 10 and between the drain 16 and the piezoresistor 10, the metal contact layers with small Young's modulus does not prevent the piezoelectric material 12 from applying a pressure to the piezoresistor 10.

In the first comparative example, the source 14 and the drain 16 are stacked in this order. Thus, when the source 14 is replaced by the drain 16, the gate bias changes. Thus, when the source 14 and the drain 16 are switched, the characteristics of the PET change.

In the first through sixth embodiments and the variations thereof, the voltage between the source 14 and the gate 18 and the voltage between the drain 16 and the gate 18 remain the same even when the source 14 and the drain 16 are switched. In addition, the shapes of the source 14 and the drain 16 can be made to be approximately identical. Therefore, even when the source 14 and the drain 16 are switched, the characteristics do not change. For this, the source 14 and the drain 16 are preferably configured so as to be symmetrical to each other across the intermediate plane between the source 14 and the drain 16 in the piezoresistor 10, and each of the piezoresistor 10, the piezoelectric material 12, and the gate 18 is preferably configured so as to be symmetric with respect to the intermediate plane between the source 14 and the drain 16 in the piezoresistor 10. In addition, even when the areas $a_{PR}$ and $A_{PE}$ are made to be different to make the area $a_{PR}$ less than the area $A_{PE}$ to improve $\alpha$ and S, the above characteristics are maintained. Thus, even when the source 14 and the drain 16 are switched, the characteristics of the PET hardly change.

Seventh Embodiment

Figure 20A:
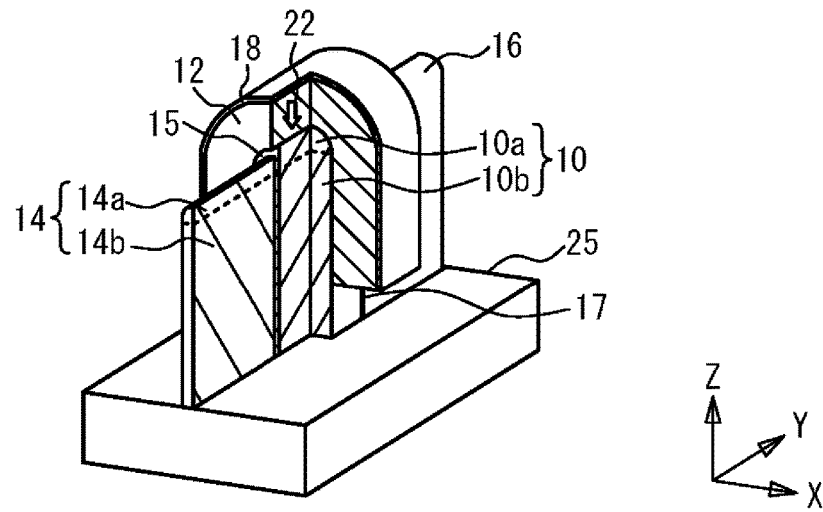
FIG. 20A is a perspective cross-sectional view of a transistor in accordance with a seventh embodiment.
Figure 20B:
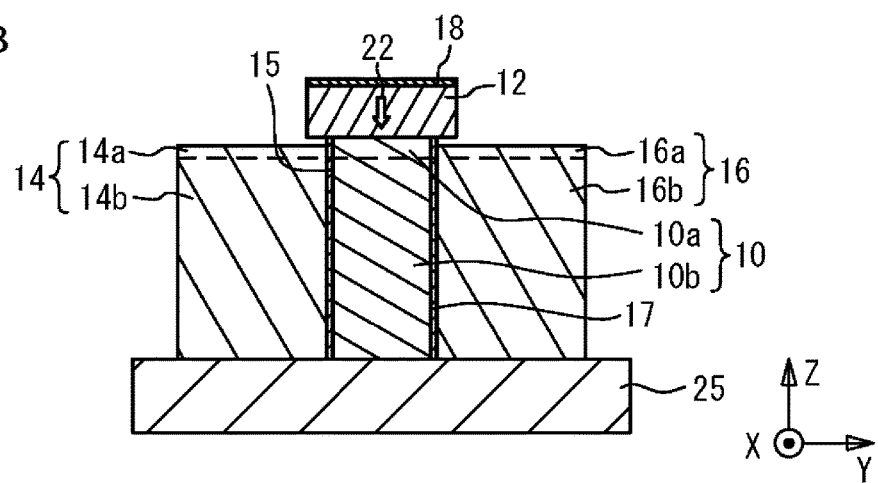
FIG. 20B and FIG. 20C are cross-sectional views.
Figure 20C:
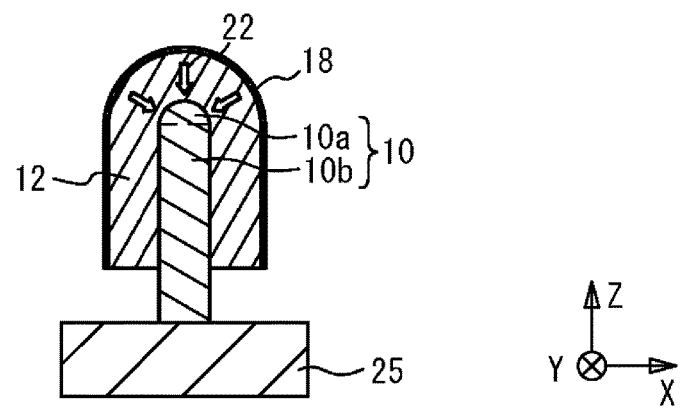

A seventh embodiment is another exemplary PET. FIG. 20A is a perspective cross-sectional view of a transistor in accordance with the seventh embodiment, and FIG. 20B and FIG. 20C are cross-sectional views. The dashed line in the piezoresistor 10, the source 14, and the drain 16 virtually divides upper portions 10a, 14a, and 16a and support portions 10b, 14b, and 16b. As illustrated in FIG. 20A through FIG. 20C, the direction from the source 14 to the drain 16 is defined as a Y direction, the direction perpendicular to the Y direction in the surface direction of a substrate 25 is defined as an X direction, and the normal direction of the substrate 25 is defined as a Z direction.

The piezoresistor 10, the source 14, and the drain 16 are formed on the substrate 25. The piezoresistor 10 includes the upper portion 10a and the support portion 10b. The upper portion 10a has a semi-cylindrical shape. The source 14 and the drain 16 are located on both ends of the piezoresistor 10 in the Y direction. The source 14 includes the upper portion 14a corresponding to the upper portion 10a of the piezoresistor 10 and the support portion 16b corresponding to the support portion 10b of the piezoresistor 10. The drain 16 includes the upper portion 16a corresponding to the upper portion 10a of the piezoresistor 10 and the support portion 16b corresponding to the support portion 10b of the piezoresistor 10. The support portions 10b, 14b, and 16b respectively support the upper portions 10a, 14a, and 16a. Carriers conduct through the piezoresistor 10 in the Y direction. The metal contact layer 15 is located between the source 14 and the piezoresistor 10, and the metal contact layer 17 is located between the drain 16 and the piezoresistor 10. The piezoelectric material 12 is located so as to surround the piezoresistor 10. The gate 18 is located around the piezoelectric material 12.

The polarization direction 22 of the piezoelectric material 12 in the first type transistor of the seventh embodiment is the direction from the gate 18 to the piezoresistor 10. The polarization direction 22 of the piezoelectric material 12 in the second type transistor is the reverse direction of the arrow 22 in FIG. 20A through FIG. 20C, and is the direction from the piezoresistor 10 to the gate 18. The polarization direction of the piezoelectric material 12 covering the support portion 10b is not illustrated. Other configurations are the same as those of the first embodiment, and the description is thus omitted.

Figure 21A:
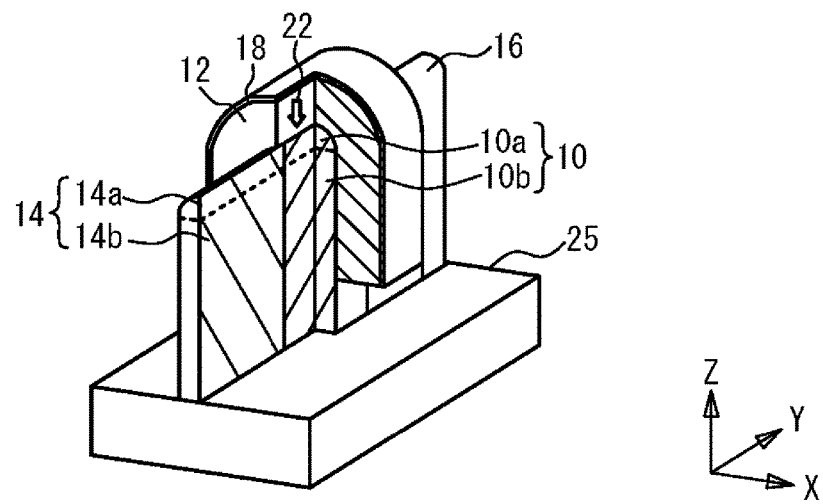
FIG. 21A is a perspective cross-sectional view of a transistor in accordance with a first variation of the seventh embodiment.
Figure 21B:
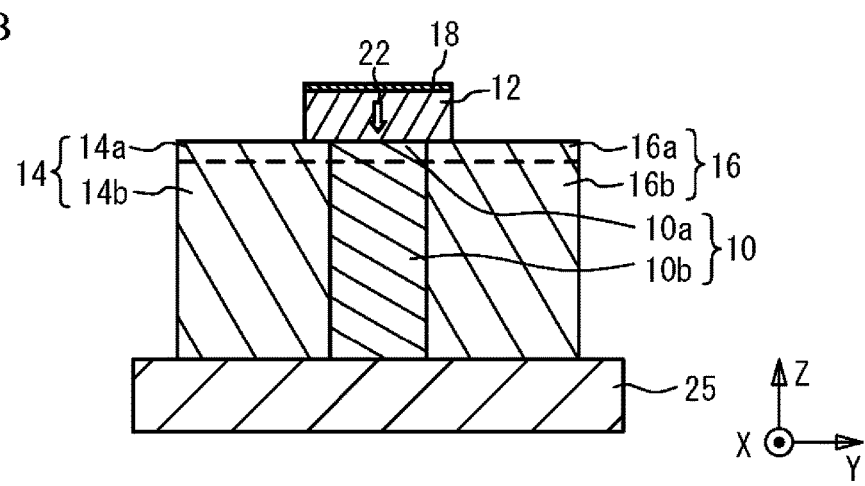
FIG. 21B is a cross-sectional view.

FIG. 21A is a perspective cross-sectional view of a transistor in accordance with a first variation of the seventh embodiment, and FIG. 21B is a cross-sectional view. As illustrated in FIG. 21A and FIG. 21B, the metal contact layers 15 and 17 are not located, and the source 14 and the drain 16 make direct contact with the piezoresistor 10. The source 14 and the drain 16 make contact with the piezoelectric material 12. Other configurations are the same as those of the seventh embodiment, and the description is thus omitted.

Figure 22A:
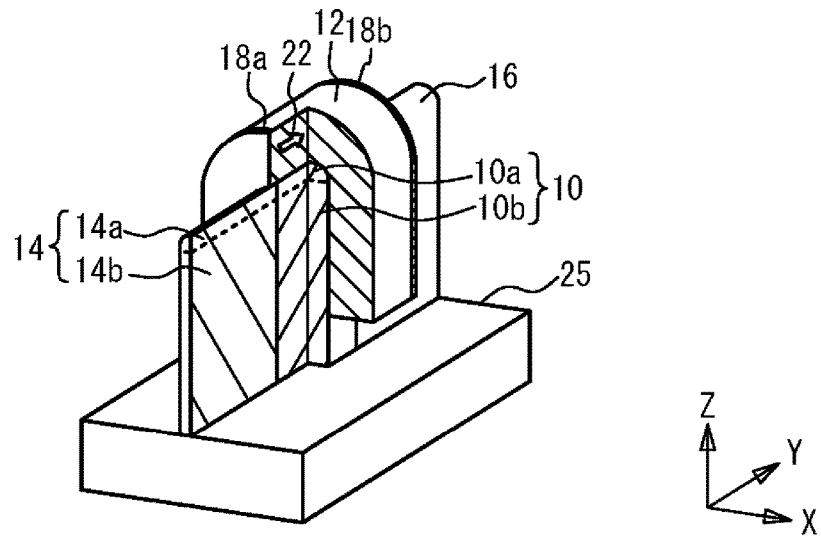
FIG. 22A is a perspective cross-sectional view of a transistor in accordance with a second variation of the seventh embodiment.
Figure 22B:
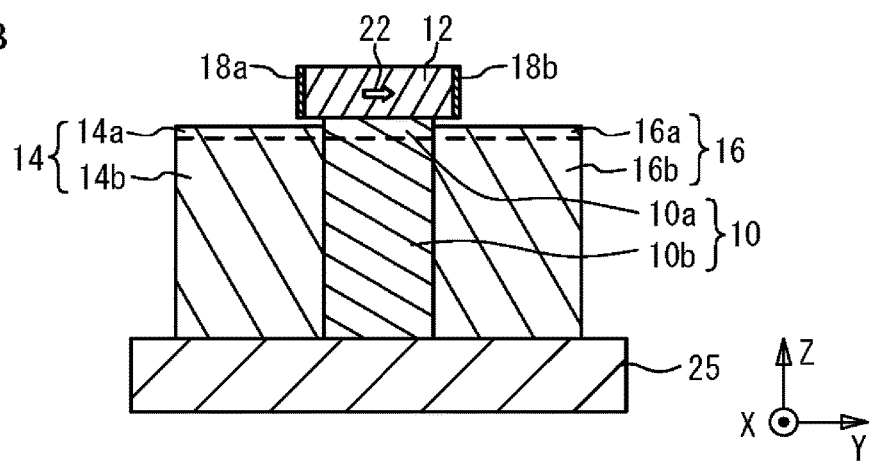
FIG. 22B and FIG. 22C are cross-sectional views.
Figure 22C:
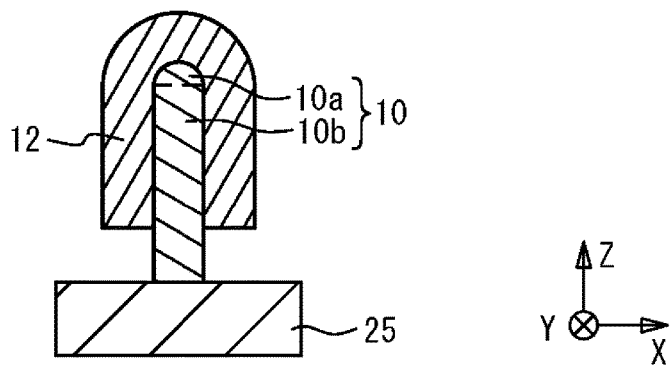

FIG. 22A is a perspective cross-sectional view of a transistor in accordance with a second variation of the seventh embodiment, and FIG. 22B and FIG. 22C are cross-sectional views. As illustrated in FIG. 22A through FIG. 22C, the gates 18a and 18b are located at both sides of the piezoelectric material 12 in the Y direction. The polarization direction 22 of the piezoelectric material 12 is the minus Y direction or the Y direction. Other configurations are the same as those of the first variation of the seventh embodiment, and the description is thus omitted. As in the seventh embodiment, the metal contact layers 15 and 17 may be located. Alternatively, the source 14 and the drain 16 may make contact with the piezoelectric material 12. At this time, the source 14 and the drain 16 are configured so as not to make contact with the gates 18a and 18b.

Figure 23:
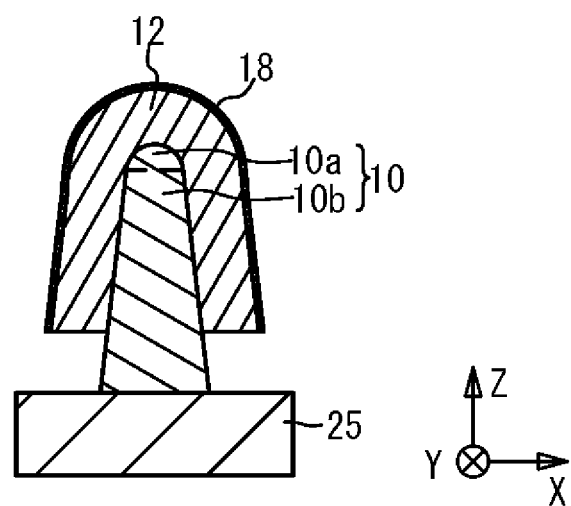
FIG. 23 is a cross-sectional view of a transistor in accordance with a third variation of the seventh embodiment.

FIG. 23 is a cross-sectional view of a transistor in accordance with a third variation of the seventh embodiment. As illustrated in FIG. 23, the cross-section of the support portion 10b has a trapezoidal shape. Other configurations are the same as those of the seventh embodiment and the first and second variations thereof, and the description is thus omitted.

As described in the seventh embodiment and the variations thereof, the piezoelectric material 12 may be located so as to partially surround the piezoresistor 10 in the directions perpendicular to the conduction direction of carriers (the Y direction). This configuration eases the formation of the piezoresistor 10 and the piezoelectric material 12 compared to the configuration where the piezoelectric material 12 is located so as to surround the piezoresistor 10 in all directions perpendicular to the conduction direction of carriers as described in the first embodiment.

If only the upper portion 10a of the piezoresistor 10 is formed on the substrate 25, a pressure of the piezoelectric material 12 is not efficiently applied to the piezoresistor 10. To solve this problem, the support portion 10b (a support) supporting the upper portion 10a is provided. The upper surface of the piezoresistor 10 is curved, and the piezoelectric material 12 is formed so as to surround the upper surface of the upper portion 10a of the piezoresistor 10 and the side surface of the support portion 10b. This configuration allows a pressure to be efficiently applied to the upper portion 10a. The case where the XZ cross-section of the upper portion 10a has a semi-circle shape has been described. However, the XZ cross-section of the upper portion 10a may have a semi-elliptical shape, a shape of a part of a circle, a shape of a part of an ellipse, or a mushroom shape. The support portion 10b may not be the piezoresistor 10. To efficiently apply a pressure to the piezoresistor 10, the support portion 10b preferably has Young's modulus and a Poisson ratio approximately equal to those of the piezoresistor 10. Thus, the material of the support portion 10b is preferably the same as the material of the piezoresistor 10. Alternatively, the material of the support portion 10b may differ from the material of the piezoresistor 10.

The support portion 14b may not be the source 14, and the support portion 16b may not be the drain 16. When the support portions 14b and 16b make contact with the piezoelectric material 12, the support portions 14b and 16b are preferably made of a material having small Young's modulus. To make the fabrication process efficient, the support portions 14b and 16b are preferably made of a material same as those of the source 14 and the drain 16. When the metal contact layers 15 and 17 are located, the metal contact layers 15 and 17 are only required to be formed between the upper portions 10a and 14a and between the upper portions 10a and 16a. The gate electrode 18 or the piezoelectric material 12 and the gate electrode 18 are preferably located away from the substrate 25 so as not to generate the electric conduction to the substrate 25. When the support portions 10b, 14b, and 16b are made of a material different from those of the upper portion 10a, 14a, and 16a, the upper surface of, for example, the substrate 25 may be processed to form the support portions 10b, 14b, and the 16b. That is, the support portions 10b, 14b, and 16b may be made of the same material as the substrate 25.

If the height of the support portion 10b is zero or low, a pressure is not efficiently applied to the upper portion 10a. The height of the support portion 10b is preferably equal to or greater than the width of the upper portion 10a of the piezoresistor.

As described in the seventh embodiment and the first variation of the seventh embodiment, the polarization direction 22 of the piezoelectric material 12 may be the direction in which the piezoelectric material 12 surrounds the piezoresistor 10 or the reverse direction thereof (for example, the normal direction of the boundary face between the piezoelectric material 12 and the piezoresistor 10 and the reverse direction of the normal direction). In this case, the operation becomes the same as those illustrated in FIG. 3A through FIG. 4B of the first embodiment. As described in the second variation of the seventh embodiment, the polarization direction 22 of the piezoelectric material 12 may be the propagation direction of carriers or the reverse direction of the propagation direction. In this case, the operation is the same as those illustrated in FIG. 5A through FIG. 5F of the variation of the first embodiment. The metal contact layers 15 and 17 may be provided, or may not be provided. Furthermore, the materials of the transistors of the seventh embodiment and the variations thereof may be the same as those of the first embodiment. The substrate 25 may be, for example, a silicon substrate. The transistors of the seventh embodiment and the variations thereof can be used for the electronic circuits of the second through fifth embodiments and the variations thereof.

In the simulation in FIG. 7A through FIG. 11B, the pressure distribution in the piezoresistor 10 is considered substantially uniform. The pressure distribution in the piezoresistor 10 becomes substantially uniform when the channel length of the piezoresistor 10 is short, or in the variation of the first embodiment and the second variation of the seventh embodiment. This simulation will be called a first simulation. However, in the first embodiment, the seventh embodiment, and the first variation of the seventh embodiment, if the channel length is configured to be longer than a certain length, the pressure is gradually applied to the piezoresistor 10. Thus, a simulation was conducted with use of the structure of FIG. 6A under the assumption that the pressure is gradually applied to the piezoresistor 10. This simulation will be called a second simulation. Each simulation can be applied to the seventh embodiment by using the effective cross-section of the upper portion 10a of the piezoresistor 10.

Figure 24A:
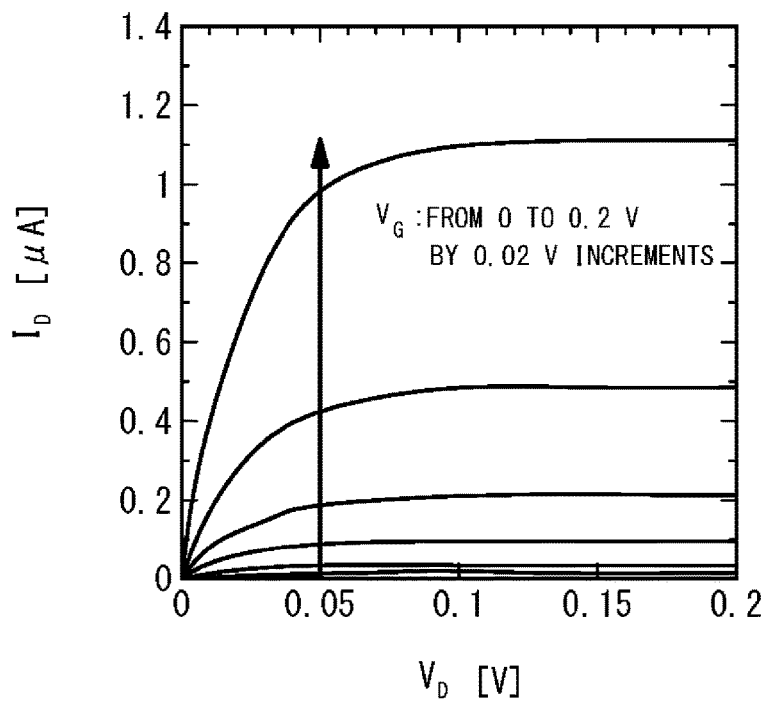
FIG. 24A illustrates a drain characteristic in a second simulation.
Figure 24B:
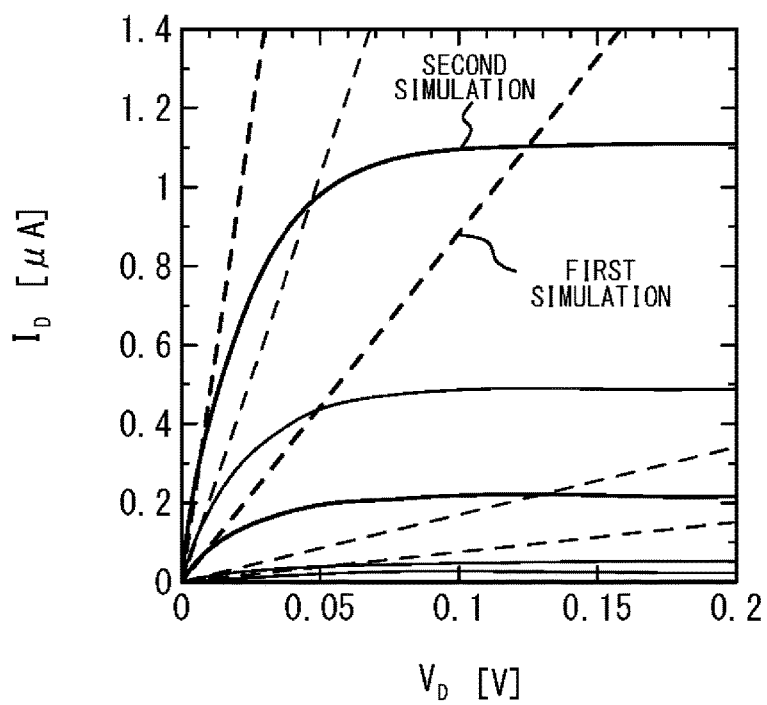
FIG. 24B illustrates drain characteristics compared between first and second simulations.

FIG. 24A illustrate a drain characteristic in the second simulation, and FIG. 24B illustrates drain characteristics compared between the first and second simulations. The parameters were set as $l_{PR}$=3 nm, $L_{PE}$=40 nm, $h_{PR}$=12 nm, $H_{PE}$=30 nm, and $a_{PR}/A_{PE}$=0.4. The gate voltage $V_G$ is varied from 0 V to 0.2 V by 0.02 V increments in the direction indicated by the arrow. As illustrated in FIG. 24A, as the drain voltage $V_D$ increases, the drain current $I_D$ saturates.

As illustrated in FIG. 24B, at a low drain voltage $V_D$, the first simulation approximately corresponds to the second simulation. However, as the drain voltage $V_D$ increases, the drain current $I_D$ does not saturate in the first simulation while the drain current $I_D$ saturates in the second simulation. As described above, in the first and seventh embodiments, the drain current $I_D$ has possibility to saturate. In the structures described in the variation of the first embodiment, the second variation of the seventh embodiment, and the first comparative example, the drain current $I_D$ does not saturate. In addition, the drain current $I_D$ may saturate also in the sixth embodiment and the variations thereof.

Figure 25:
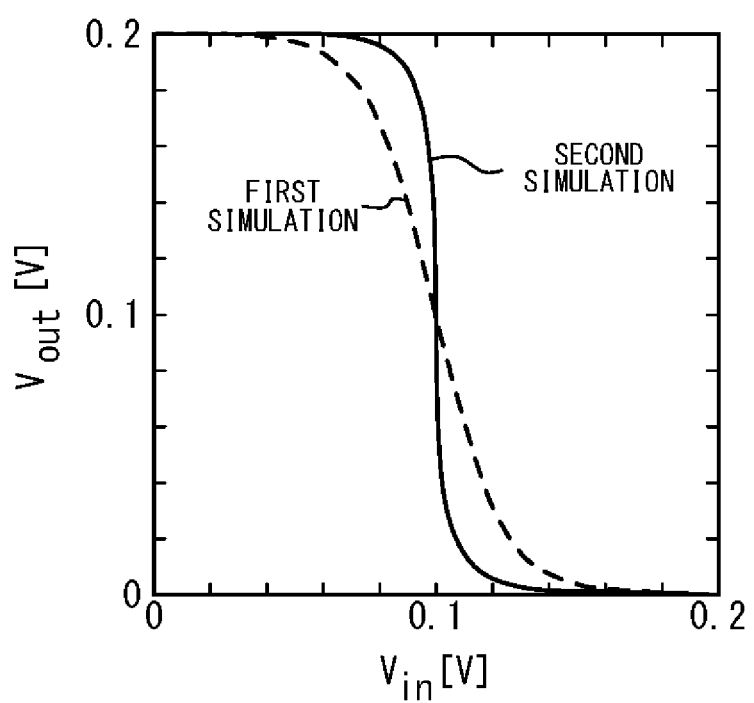
FIG. 25 illustrates the transfer characteristic of an inverter circuit.

Next, simulated was a transfer characteristic when the transistor of the seventh embodiment is used as the PETs 97a and 97b of the inverter circuit 91 illustrated in FIG. 17A and FIG. 17B of the fifth embodiment. FIG. 25 illustrates the transfer characteristic of the inverter circuit. As illustrated in FIG. 25, in the second simulation, an output voltage Vout rapidly changes as an input voltage Vin changes compared to that in the first simulation.

Figure 26A:
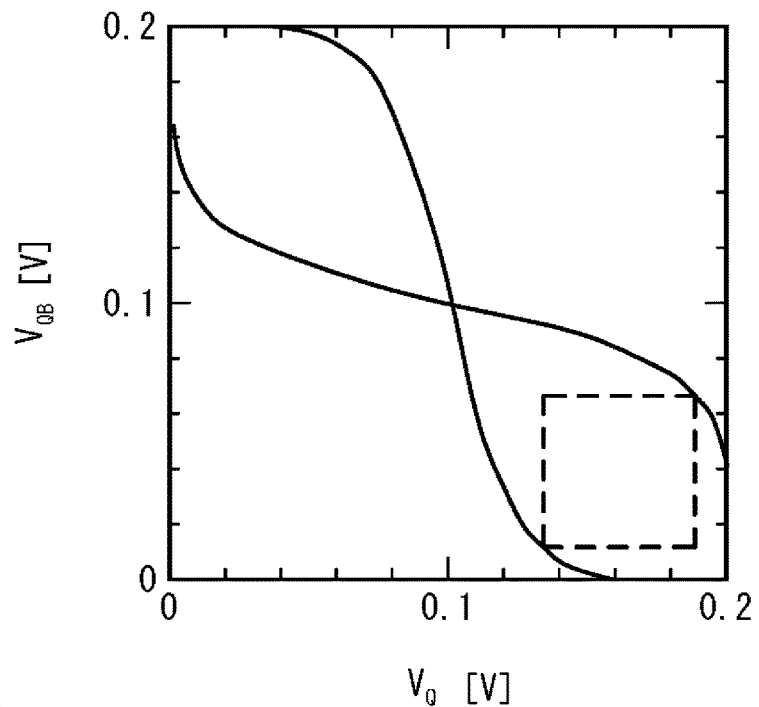
FIG. 26A and FIG. 26B illustrate butterfly curves of bistable circuits in the first and second simulations, respectively.
Figure 26B:
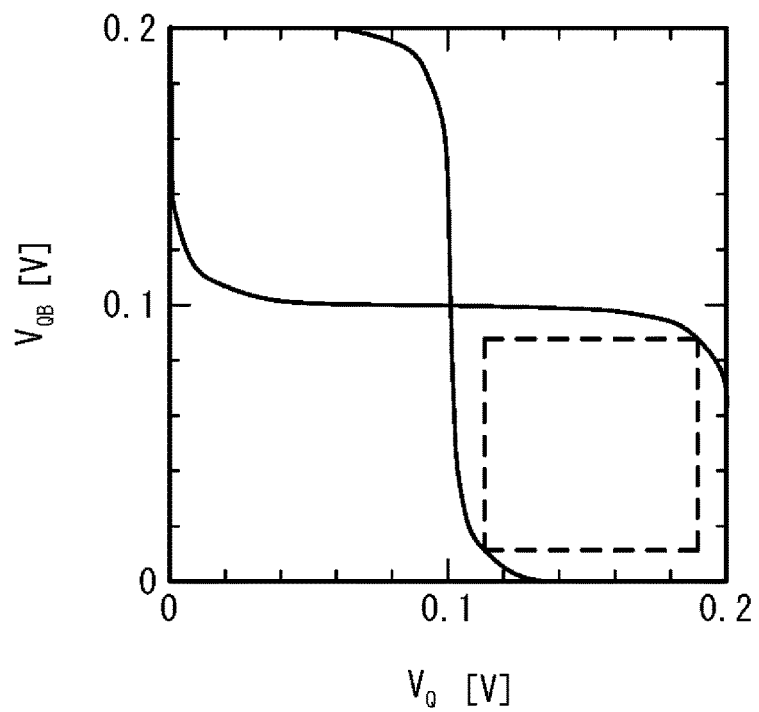

With use of FIG. 25, simulated was a butterfly curve in a bistable circuit in which the inverter circuit 91 is connected in a loop shape. FIG. 26A and FIG. 26B illustrate butterfly curves of the bistable circuit in the first and second simulations, respectively, and are graphs of the voltage $V_{QB}$ of the node QB versus the voltage $V_Q$ of the node Q. The dashed line indicates a maximum square put into the aperture of the butterfly curve. The length of a side of the square corresponds to a noise margin. As illustrated in FIG. 26A, when the drain current does not saturate as in the first simulation, the noise margin is approximately 55 mV. As illustrated in FIG. 26B, when the drain current saturates as in the second simulation, the noise margin is approximately 77 mV. In the example of the simulations, the noise margin when the drain current saturates is 1.4 times greater than the noise margin when the drain current does not saturate.

As in the first and seventh embodiments, the polarization direction of the piezoelectric material 12 is configured to be the direction from the piezoresistor 10 to the gate 18 or the direction from the gate 18 to the piezoresistor 10. This configuration can saturate the drain current as in the second simulation. Accordingly, the noise margin can be increased as illustrated in FIG. 26B.

Eighth Embodiment

Figure 27:
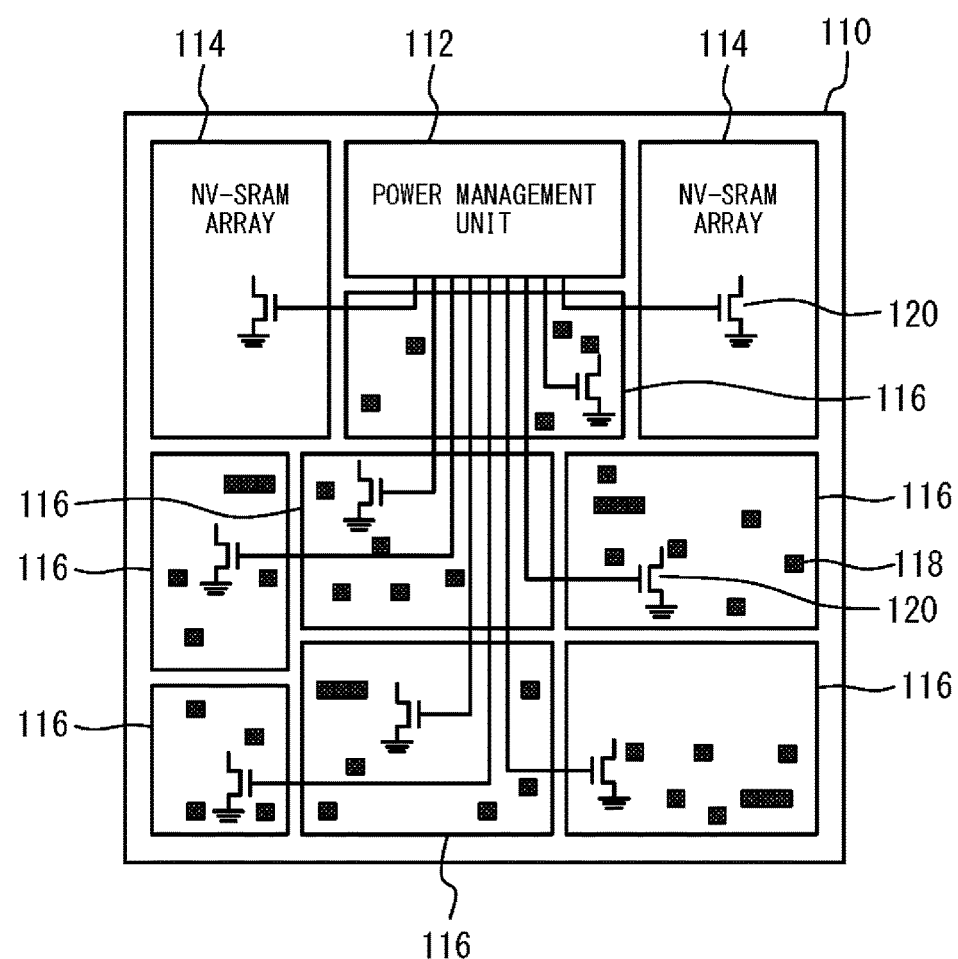
FIG. 27 is a block diagram of an electronic circuit in accordance with an eighth embodiment.

FIG. 27 is a block diagram of an electronic circuit in accordance with an eighth embodiment. The electronic circuit includes a microprocessor 110, a power management unit 112, non-volatile SRAM arrays 114, and power domains 116. The non-volatile SRAM array 114 includes a power switch 120. The power domain 116 includes the power switch 120 and a non-volatile flip-flop 118. The power management unit 112 uses the non-volatile SRAM array 114 and the power switch 120 of the power domain 116 to cut or reduce the power supplied to the non-volatile SRAM array 114 and the power domain 116.

The memory cells described in the third and fourth embodiments can be used for the non-volatile SRAM array 114. This configuration allows the non-volatile SRAM array 114 to be driven at a low voltage. Furthermore, non-volatile memorizing becomes possible, for example, when the power is cut off. The flip-flop circuit described in the variation of the third embodiment can be used for the non-volatile flip-flop 118 in the power domain 116. This configuration allows the non-volatile flip-flop 118 to be driven at a low voltage. Furthermore, non-volatile memorizing becomes possible at the time of, for example, cutting off the power. The logic circuits described in the fifth embodiment can be used as the logic circuit in the power domain 116. This configuration allows the logic circuit to be driven at a low voltage and at high-speed compared to a typical CMOS circuit. The power switch described in the second embodiment can be used as the power switch 120. This configuration can reduce the decrease in voltage due to the power switch 120. The above described configuration allows for more ideal non-volatile power gating of a logic system driven at a low voltage.

Although preferred embodiments of the present invention have been described so far, the present invention is not limited to those particular embodiments, and various changes and modifications may be made to them within the scope of the invention claimed herein.

DESCRIPTION OF REFERENCE NUMERALS 10 piezoresistor
10a upper portion
10b support portion
12 piezoelectric material
14 source
16 drain
18 gate
22 dielectric polarization direction
30, 90 PET
32 circuit
80 non-volatile element

The invention claimed is:

1. A transistor comprising:
a piezoresistor through which carriers conduct;
a source that injects the carriers into the piezoresistor;
a drain that receives the carriers from the piezoresistor;
a piezoelectric material that is located so as to surround the piezoresistor and applies a pressure to the piezoresistor; and
a gate that applies a voltage to the piezoelectric material so that the piezoelectric material applies a pressure to the piezoresistor,
wherein the piezoelectric material is located outside the piezoresistor in a plurality of directions, and the plurality of directions intersects with a direction from the source to the drain.

2. The transistor of claim 1, wherein
the gate is located outside the piezoelectric material, and
the piezoelectric material is dielectrically polarized in a direction from the piezoresistor to the gate or in a direction from the gate to the piezoresistor.

3. The transistor of claim 1, wherein
a plurality of the gates are located in the direction from the source to the drain, and
the piezoelectric material is dielectrically polarized in the direction from the source to the drain or in a direction from the drain to the source.

4. The transistor of claim 1, wherein
the piezoelectric material is located outside the piezoresistor in all directions perpendicular to the direction from the source to the drain.

5. The transistor of claim 1, wherein
the piezoelectric material is located outside the piezoresistor in part of directions perpendicular to the direction from the source to the drain.

6. The transistor of claim 1, further comprising:
a support that is formed on a substrate and supports the piezoresistor,
wherein an upper surface of the piezoresistor is curved, and
the piezoelectric material is located outside the upper surface of the piezoresistor and a side surface of the support.

7. The transistor of claim 6, wherein
a height of the support is greater than a width of the piezoresistor.

8. The transistor of claim 6, wherein
a material of the support is identical to a material of the piezoresistor.

9. The transistor of claim 6, wherein
a material of the support differs from a material of the piezoresistor.

10. A transistor comprising:
a piezoresistor through which carriers conduct;
a source that injects the carriers into the piezoresistor;
a drain that receives the carriers from the piezoresistor, a first direction being a direction from the source to the drain;
a piezoelectric material that applies a pressure to the piezoresistor in a second direction intersecting with the first direction and is located outside the piezoresistor in the second direction; and
a gate that applies a voltage to the piezoelectric material so that the piezoelectric material applies a pressure to the piezoresistor.

11. The transistor of claim 1, wherein
the source and the drain are symmetrical to each other across an intermediate plane between the source and the drain in the piezoresistor, and
each of the piezoresistor, the piezoelectric material, and the gate is symmetric with respect to the intermediate plane.

12. An electronic circuit comprising:
a circuit that is connected between a first power source and a second power source; and
the transistor of claim 1 in which one of the source and the drain is coupled to the first power source, another of the source and the drain is coupled to a supply terminal of the circuit, and a signal that cuts electric power supplied to the circuit is input to the gate.

13. The electronic circuit of claim 12, further comprising:
a bistable circuit that stores data; and
a non-volatile element that stores, in a non-volatile manner, data stored in the bistable circuit, and restores, to the bistable circuit, the data stored in a non-volatile manner,
wherein the circuit is the bistable circuit.

14. The electronic circuit of claim 13, wherein
the non-volatile element is connected between a node in the bistable circuit and a control line.

15. An electronic circuit comprising:
a non-volatile memory cell including:
a non-volatile element; and
the transistor of claim 1 in which the source or the drain is connected in series to the non-volatile element.

16. An electronic circuit comprising:
first and second transistors that are the transistor of claim 1 and complement each other,
wherein dielectric polarization directions of the piezoelectric materials of the first and second transistors are opposite to each other, and are directions that allow the piezoelectric material to apply a pressure to the piezoresistor when a positive voltage or a negative voltage with respect to the source is applied to the gate.

17. An electronic circuit comprising:
a circuit that is connected between a first power source and a second power source; and
the transistor of claim 10 in which one of the source and the drain is coupled to the first power source, another of the source and the drain is coupled to a supply terminal of the circuit, and a signal that cuts electric power supplied to the circuit is input to the gate.

18. The electronic circuit of claim 17, further comprising:
a bistable circuit that stores data; and
a non-volatile element that stores, in a non-volatile manner, data stored in the bistable circuit, and restores, to the bistable circuit, the data stored in a non-volatile manner,
wherein the circuit is the bistable circuit.

19. An electronic circuit comprising:
a non-volatile memory cell including:
   a non-volatile element; and
   the transistor of claim 10 in which the source or the drain is connected in series to the non-volatile element.

20. An electronic circuit comprising:
first and second transistors that are the transistor of claim 10 and complement each other,
wherein dielectric polarization directions of the piezoelectric materials of the first and second transistors are opposite to each other, and are directions that allow the piezoelectric material to apply a pressure to the piezoresistor when a positive voltage or a negative voltage with respect to the source is applied to the gate.

* * * * *